United States Patent
Kim et al.

(10) Patent No.: US 12,422,962 B2
(45) Date of Patent: Sep. 23, 2025

(54) ELECTRONIC DEVICE INCLUDING CIRCUIT BOARD INCLUDING ELECTROMAGNETIC SHIELDING LAYER

(71) Applicant: Samsung Display Co., Ltd., Yongin-si (KR)

(72) Inventors: Sungu Kim, Seoul (KR); Kukbin Lim, Seoul (KR); Taekwang Kim, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 2 days.

(21) Appl. No.: 18/388,111

(22) Filed: Nov. 8, 2023

(65) Prior Publication Data

US 2024/0081126 A1 Mar. 7, 2024

Related U.S. Application Data

(63) Continuation of application No. 17/864,087, filed on Jul. 13, 2022, now Pat. No. 11,849,622.

(30) Foreign Application Priority Data

Aug. 2, 2021 (KR) .......................... 10-2021-0101456

(51) Int. Cl.
*G06F 3/044* (2006.01)
*G06F 1/16* (2006.01)
(Continued)

(52) U.S. Cl.
CPC .......... *G06F 3/0446* (2019.05); *G06F 1/1616* (2013.01); *G06F 1/1643* (2013.01);
(Continued)

(58) Field of Classification Search
CPC .... H10K 59/40; H10K 50/865; H10K 59/131; H10K 59/38; H10K 59/8792;
(Continued)

(56) References Cited

U.S. PATENT DOCUMENTS 10,019,088 B2 7/2018 Kim et al.
10,431,887 B2 10/2019 Kim et al.
(Continued)

FOREIGN PATENT DOCUMENTS

KR 20160122514 A 10/2016
KR 1020170039056 A 4/2017
(Continued)

OTHER PUBLICATIONS

Korea Search Report for Korean Patent Application No. 10-2021-0101456, filed on Aug. 2, 2021, 13 pages.

*Primary Examiner* — Pegeman Karimi
(74) *Attorney, Agent, or Firm* — CANTOR COLBURN LLP

(57) ABSTRACT

An electronic device including a display panel which displays an image, an input sensor on the display panel, and including a first sensing electrode, a second sensing electrode crossing the first sensing electrode, first and second signal lines connected to ends of the first sensing electrode, and a third signal line connected to one end of the second sensing electrode, and a circuit board electrically connected to the input sensor. The circuit board includes a plurality of insulating layers, a first group signal line disposed on the plurality of insulating layers, and one end of which is electrically connected to the first signal line, a second group signal line disposed on the plurality of insulating layers, and one end of which is electrically connected to the second signal line, and an electromagnetic shielding layer disposed on a portion of the second group signal line.

15 Claims, 12 Drawing Sheets

(51) Int. Cl.
*H10K 50/86* (2023.01)
*H10K 59/131* (2023.01)
*H10K 59/38* (2023.01)
*H10K 59/40* (2023.01)
*H10K 59/80* (2023.01)

(52) U.S. Cl.
CPC ......... *H10K 50/865* (2023.02); *H10K 59/131* (2023.02); *H10K 59/38* (2023.02); *H10K 59/40* (2023.02); *H10K 59/8792* (2023.02); *G06F 2203/04107* (2013.01)

(58) Field of Classification Search
CPC .... G06F 1/1616; G06F 1/1643; G06F 3/0446; G06F 2203/04107; G06F 1/1652; G06F 2203/04111; G06F 3/0412; G06F 3/04164; G06F 3/0418; H05K 1/0221
See application file for complete search history.

(56) References Cited

U.S. PATENT DOCUMENTS

| | | | |
|---|---|---|---|
| 10,928,939 B2* | 2/2021 | No | G06F 3/0445 |
| 11,126,288 B2 | 9/2021 | Kim et al. | |
| 11,132,098 B2 | 9/2021 | Bok et al. | |
| 11,281,346 B2* | 3/2022 | Hirotsugu | G06F 3/0446 |
| 2013/0234115 A1 | 9/2013 | Song et al. | |
| 2019/0302942 A1* | 10/2019 | Kim | H10K 59/88 |
| 2020/0319731 A1* | 10/2020 | Yeke Yazdandoost | H10F 55/255 |
| 2020/0409509 A1* | 12/2020 | Bok | G06F 3/04164 |
| 2021/0034180 A1* | 2/2021 | Hirotsugu | G06F 3/0446 |
| 2022/0310769 A1* | 9/2022 | Zeng | G09G 3/3225 |
| 2022/0386449 A1* | 12/2022 | Gong | H05K 1/0216 |

FOREIGN PATENT DOCUMENTS

| | | |
|---|---|---|
| KR | 1020180008968 A | 1/2018 |
| KR | 1020190114063 A | 10/2019 |
| KR | 20200071578 A | 6/2020 |
| KR | 1020210002163 A | 1/2021 |
| KR | 1020210016258 A | 2/2021 |

* cited by examiner

ELECTRONIC DEVICE INCLUDING CIRCUIT BOARD INCLUDING ELECTROMAGNETIC SHIELDING LAYER

This application is a continuation of U.S. patent application Ser. No. 17/864,087, filed on Jul. 13, 2022, which claims priority to Korean Patent Application No. 10-2021-0101456, filed on Aug. 2, 2021, and all the benefits accruing therefrom under 35 U.S.C. § 119, the content of which in its entirety is herein incorporated by reference.

BACKGROUND

1. Field

The disclosure herein relates to an electronic device with improved reliability by reducing noise of a circuit board while improving sensing sensitivity in some regions, and to a display panel included therein.

2. Description of the Related Art

Recently, electronic devices such as a television, a mobile phone, a tablet computer, a navigation device, and a game machine typically include a display device for displaying an image. Such electronic devices may include an input sensor capable of providing a touch-based input method that allows a user to easily input information or commands in an intuitive and convenient manner, in addition to a general input method using, for example, a button, a keyboard, or a mouse.

SUMMARY

In an electronic device including an input sensor, the input sensor may sense a touch or pressure using the user's body. Electronic components such as an input sensor may be electrically connected to an external circuit through pads. As the degree of integration of electronic components increases and the number of signal lines increases, the number of pads to be provided may also increase. In addition, as the number of signal lines increases, a detailed patterning process for forming fine-sized signal lines is desired.

The disclosure provides an electronic device with improved reliability by reducing noise of a circuit board while improving the sensing sensitivity of an input sensor.

An embodiment of the invention provides an electronic device which includes a display panel including a plurality of light-emitting elements, an input sensor disposed on the display panel, where the input sensor includes a first sensing electrode, a second sensing electrode crossing the first sensing electrode, a first signal line connected to one end of the first sensing electrode, a second signal line connected to another end of the first sensing electrode, and a third signal line connected to one end of the second sensing electrode, and a circuit board electrically connected to the input sensor. In such an embodiment, the circuit board includes a plurality of insulating layers, a first group signal line at least a portion of which is disposed on the plurality of insulating layers and one end of which is electrically connected to the first signal line, a second group signal line at least a portion of which is disposed on the plurality of insulating layers and one end of which is electrically connected to the second signal line, and an electromagnetic shielding layer disposed on a portion of the second group signal line.

In an embodiment, the plurality of insulating layers may include a first insulating layer and a second insulating layer disposed on the first insulating layer, the second insulating layer includes a plurality of sub-insulating layers, the portion of the second group signal line may be disposed on an uppermost layer among the plurality of sub-insulating layers.

In an embodiment, the first insulating layer may include a first lower sub-insulating layer and a first upper sub-insulating layer disposed on the first lower sub-insulating layer, the second insulating layer includes a second lower sub-insulating layer and a second upper sub-insulating layer disposed on the second lower sub-insulating layer, and at least a portion of the second group signal line may be disposed on the second upper sub-insulating layer.

In an embodiment, the second group signal may include an outermost signal line disposed on the second upper sub-insulating layer, and the electromagnetic shielding layer may cover the outermost signal line.

In an embodiment, the portion of the second group signal line may be disposed on the second lower sub-insulating layer, and another portion of the second group signal line may be disposed on the second upper sub-insulating layer.

In an embodiment, the electronic device may further include an anti-reflection layer disposed on the input sensor, and the anti-reflection layer may include a division layer in which a plurality of division openings overlapping the plurality of light-emitting elements, respectively, is defined and a plurality of color filters disposed to correspond to the plurality of division openings, respectively.

In an embodiment, the electronic device may further include a shock absorbing layer disposed on the anti-reflection layer.

In an embodiment, the electronic device may further include a window module disposed on the shock absorbing layer, and the window module may include a window protective layer and a thin film glass substrate.

In an embodiment, the electronic device may further include an electronic module disposed below the display panel, where the electronic module may receive an optical signal, the display panel may include a first display region through which an optical signal passes, a second display region adjacent to the first display region, and a peripheral region adjacent to the second display region, and the electronic module may overlap the first display region.

In an embodiment, the display panel may include a first non-folding region, a second non-folding region, and a folding region disposed between the first non-folding region and the second non-folding region.

In an embodiment, the input sensor and the circuit board may be electrically connected to each other by an anisotropic conductive adhesive layer.

In an embodiment, the display panel may further include an encapsulation layer covering the plurality of light-emitting elements, and the input sensor may be disposed directly on the encapsulation layer.

In an embodiment, the electronic device may further include a support layer disposed below the display panel, a cover layer disposed below the support layer, and a digitizer disposed below the cover layer.

In an embodiment of the invention, an electronic device includes a display panel including a plurality of light-emitting elements, an input sensor disposed on the display panel, where the input sensor includes a first sensing electrode, a second sensing electrode crossing the first sensing electrode, a first signal line connected to one end of the first sensing electrode, a second signal line connected to another end of the first sensing electrode, and a third signal line connected to one end of the second sensing electrode, an anti-reflection layer disposed on the input sensor, where the anti-reflection layer includes a division layer in which a plurality of division openings overlapping the plurality of light-emitting elements, respectively, is defined and a plurality of color filters disposed to correspond to the plurality of division openings, respectively, and a circuit board electrically connected to the input sensor. In such an embodiment, the circuit board includes a plurality of insulating layers, a plurality of group signal lines connected to at least one selected from the first signal line and the second signal line, where the plurality of group signal lines includes an outermost signal line disposed on an uppermost layer among the plurality of insulating layers, and an electromagnetic shielding layer disposed on the outermost signal line.

In an embodiment, the plurality of group signal lines may include a plurality of first sub-group signal lines and a plurality of second sub-group signal lines disposed in a layer different from a layer in which the plurality of first sub-group signal lines are disposed and the plurality of second sub-group signal lines may include a portion overlapping, on a plane, at least a portion of the plurality of first sub-group signal lines.

In an embodiment, the electromagnetic shielding layer may be disposed directly on the outermost signal line.

In an embodiment, the input sensor may be disposed directly on the display panel, and the anti-reflection layer may be disposed directly on the input sensor.

In an embodiment of the invention, an electronic device includes a display panel including a plurality of light-emitting elements, a first region having a transmissive region and an element region, and a second region adjacent to the first region, a window disposed on the display panel, an electronic module disposed below the first region of the display panel, housings disposed below the display panel and the electronic module, an input sensor disposed between the display panel and the window, where the input sensor includes a first sensing electrode, a first signal line connected to one end of the first sensing electrode, and a second signal line connected to the other end of the first sensing electrode, and a circuit board electrically connected to the input sensor. In such an embodiment, the circuit board includes a plurality of insulating layers, a plurality of group signal lines connected to at least one selected from the first signal line and the second signal line, where the plurality of group signal lines includes an outermost signal line disposed on an uppermost layer among the plurality of insulating layers, and an electromagnetic shielding layer disposed on a portion of the outermost signal line.

In an embodiment, the electromagnetic shielding layer may cover an entire portion of the outermost signal line, and the uppermost layer among the plurality of insulating layers may be partially in contact with the electromagnetic shielding layer.

In an embodiment, electronic device may further include an anti-reflection layer disposed on the input sensor. In such an embodiment, the anti-reflection layer may include a division layer, in which a plurality of division openings overlapping the plurality of light-emitting elements, respectively, is defined, and a plurality of color filters disposed corresponding to the plurality of division openings, respectively.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1A:
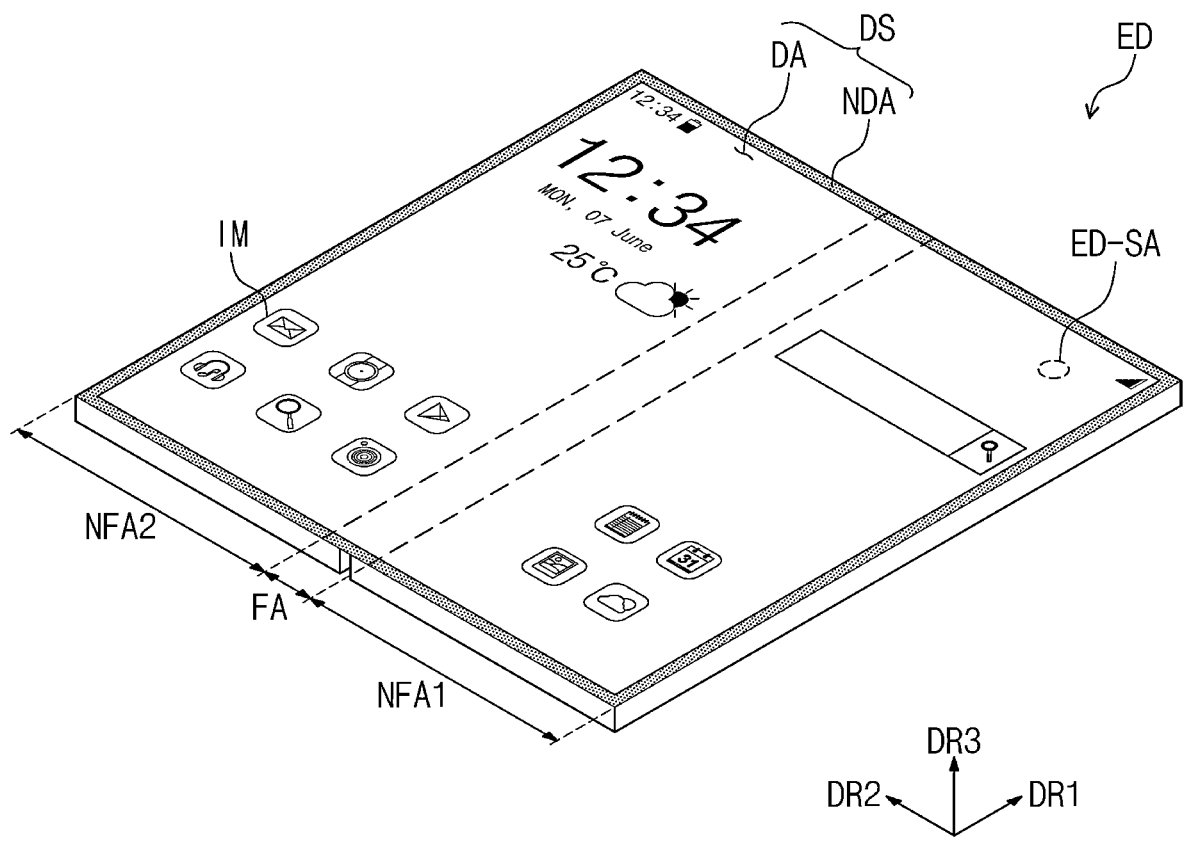
FIGS. 1A and 1B are perspective views of an electronic device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element (or a region, a layer, a portion, etc.) is referred to as being "on", "connected to" or "coupled to" another element, it can be directly disposed on, connected or coupled to the other element or intervening elements may be present therebetween. In contrast, when an element is referred to as being "directly on" another element, there are no intervening elements present.

Like reference numerals or symbols refer to like elements throughout. In addition, in the drawings, the thicknesses, the ratios, and the dimensions of elements are exaggerated for effective explanation of technical contents.

It will be understood that, although the terms first, second, etc., may be used herein to describe various elements, the elements should not be limited by these terms. These terms are exclusively used to distinguish one element from another element. For example, a first element could be termed as a second element, and similarly, the second element could be termed as the first element. The singular forms are intended to include the plural forms as well, unless the context clearly indicates otherwise.

In addition, the terms "below", "beneath", "on" and "above" are used for explaining the relation of elements illustrated in the drawings. The terms are relative concept and are explained based on the direction illustrated in the drawing.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this invention belongs. Furthermore, it will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1B:
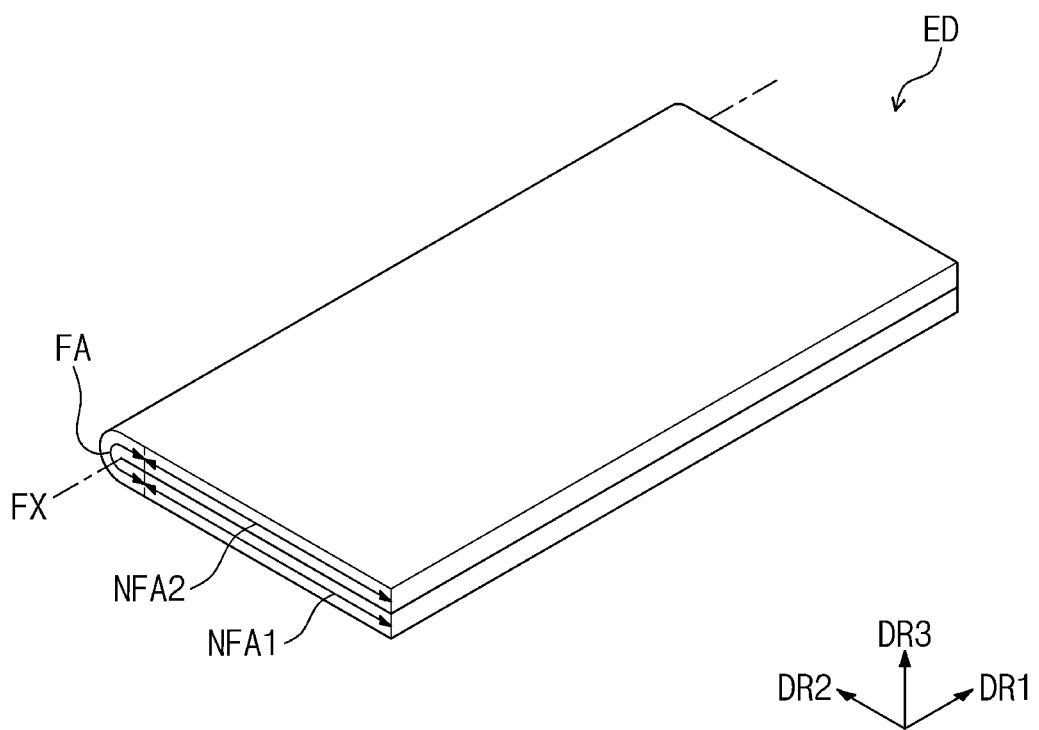

FIGS. 1A and 1B are perspective views of an electronic device ED according to an embodiment of the invention. FIG. 1A illustrates the electronic device ED in an unfolded state, and FIG. 1B illustrates the electronic device ED in a folded state.

With reference to FIGS. 1A and 1B, the electronic device ED according an embodiment of the invention may include a display surface DS defined by a first direction DR1 and a second direction DR2 crossing the first direction DR1. The electronic device ED may provide a user with an image IM through the display surface DS.

The display surface DS may include a display region DA and a non-display region NDA adjacent to the display region DA. The display region DA may display an image IM, and the non-display region NDA may not display an image IM. The non-display region NDA may enclose the display region DA. However, an embodiment of the invention is not limited thereto, and the shape of the display region DA and the shape of the non-display region NDA may be variously modified.

Hereinafter, a direction which substantially and vertically crosses a plane defined by the first direction DR1 and the second direction DR2 is defined as a third direction DR3. The third direction DR3 may be a thickness direction of the electronic device ED. In addition, the wording, "on a plane" described herein may be defined as a state of being viewed in the third direction DR3.

A sensing region ED-SA may be defined in the display region DA of the electronic device ED. FIG. 1A illustrates an embodiment including a single sensing region ED-SA, for example, but the number of sensing regions ED-SA may not be limited thereto. The sensing region ED-SA may be a portion of the display region DA. Thus, the electronic device ED may display an image through the sensing region ED-SA.

An electronic module may be disposed in a region overlapping the sensing region ED-SA. The electronic module may receive an external input transmitted through the sensing region ED-SA or provide an output through the sensing region ED-SA. In an embodiment, for example, the electronic module may be a camera module, a sensor such as a proximity sensor for measuring the distance, a sensor for recognizing a user's body portion (e.g., a fingerprint, an iris, or a face), or a small-sized lamp for outputting light. However, an embodiment of the invention is not particularly limited thereto. Hereinafter, for convenience of description, embodiments in which an electronic module overlapping the sensing region ED-SA is a camera module will be described in detail.

The electronic device ED may include a folding region FA and a plurality of non-folding regions NFA1 and NFA2. The non-folding regions NFA1 and NFA2 may include a first non-folding region NFA1 and a second non-folding region NFA1. In the second direction DR2, the folding region FA may be disposed between the first non-folding region NFA1 and the second non-folding region NFA2. The folding region FA may be referred to as a foldable region, and the first and second non-folding regions NFA1 and NFA2 may be referred to as first and second non-foldable regions.

In an embodiment, as illustrated in FIG. 1B, the folding region FA may be folded with respect to a folding axis FX parallel to the first direction DR1. In a state where the electronic device ED is being folded, the folding region FA has a predetermined curvature and a radius of curvature. The first non-folding region NFA1 and the second non-folding region NFA2 may face each other, and the electronic device ED may be in-folded so that the display surface DS is not exposed to the outside.

In an embodiment of the invention, an electronic device ED may be out-folded so that a display surface DS is exposed to the outside. In an embodiment, the electronic device ED may be configured in a way such that an in-folding or out-folding operation from an unfolding operation is repetitively performed. However, an embodiment of the invention is not limited thereto. In an embodiment, the electronic device ED may be configured to operate in one selected from an unfolding operation, an in-folding operation, or an out-folding operation.

In an embodiment, as shown in FIGS. 1A and 1B, the electronic device ED may be a foldable electronic device, but the application of the invention is not limited to the foldable electronic device ED. In an alternative embodiment, for example, the electronic device ED may be a rigid electronic device, for example, an electronic device without a folding region FA.

Figure 2A:
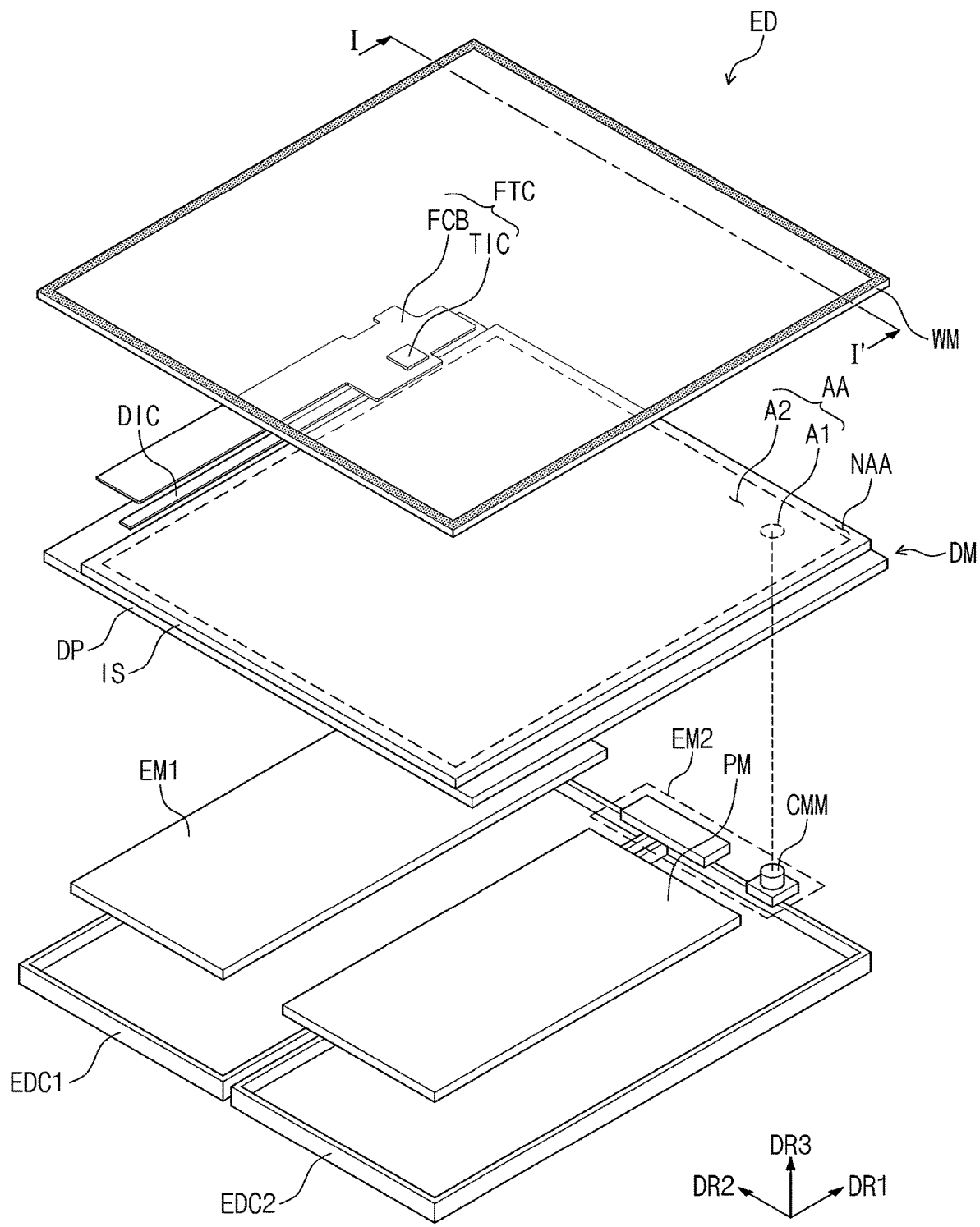
FIG. 2A is an exploded perspective view of an electronic device according to an embodiment of the invention.
Figure 2B:
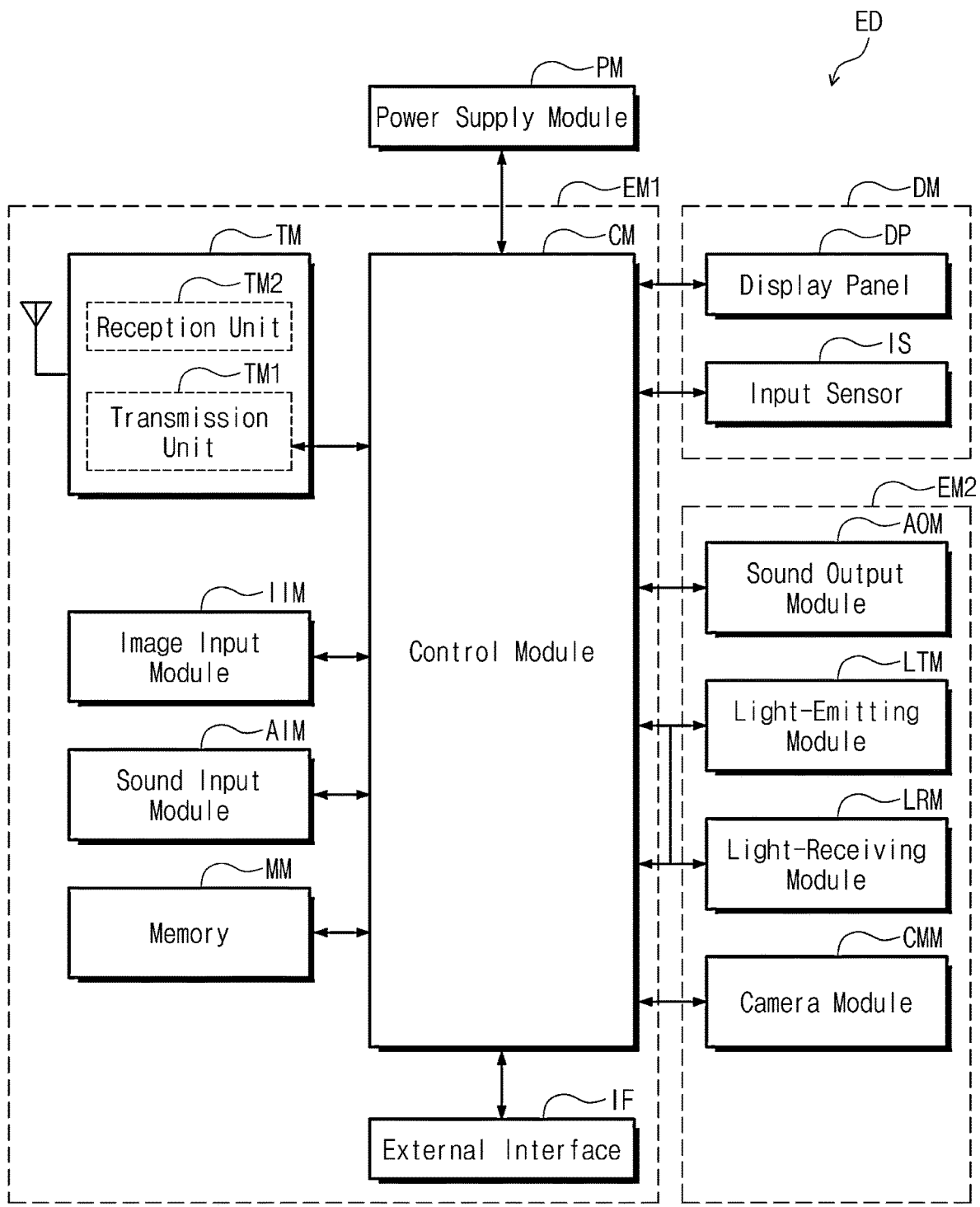
FIG. 2B is a block diagram of an electronic device according to an embodiment of the invention.

FIG. 2A is an exploded perspective view of an electronic device ED according to an embodiment of the invention. FIG. 2B is a block diagram of an electronic device ED according to an embodiment of the invention.

Referring to FIGS. 2A and 2B, an embodiment of the electronic device ED may include a window module WM, a display module DM, a first electronic module EM1, a second electronic module EM2, a power module PM, and housings EDC1 and EDC2. Although not separately illustrated, the electronic device ED may further include a mechanism structure for controlling a folding operation of the display module DM.

In an embodiment, the electronic device ED includes a window module WM and a display module DM. The window module WM provides a front surface of the electronic device ED. The display module DM may include at least a display panel DP. The display module DM generates an image and senses an external input.

The display module DM includes a display panel DP, an input sensor IS, a driving circuit DIC (hereinafter, a first driving circuit), and a circuit module FTC.

The display module DM includes an active region AA and a peripheral region NAA corresponding to the display region DA (FIG. 1A) and the non-display region NDA (FIG. 1A), respectively.

The active region AA may be not only a region in which an image IM is displayed but also a region in which an external input TC is sensed. The active region AA corresponds to a transmissive region TA and the peripheral region corresponds to a bezel region BZA. A "regions/portions correspond to each other" described herein indicates "regions/portions overlapping each other", and is not limited to regions/portions having a same area and/or a same shape as each other.

The display panel DP generates substantially an image IM. The display panel DP may be an organic light-emitting display panel or an inorganic light-emitting display panel such as a quantum dot light-emitting display panel. Types of panel are determined based on a constitution material of a light-emitting element. A light-emitting layer of the organic light-emitting display panel may include an organic light-emitting material. A light-emitting layer of the quantum dot light-emitting display panel may include quantum dots and/or quantum rods. Hereinafter, embodiments where the display panel DP is an organic light-emitting display panel will be described in detail.

The input sensor IS senses an external input (e.g., a touch event) applied from the outside. In an embodiment, the input sensor IS may be a capacitive touch sensor, but may not be particularly limited thereto. In an embodiment, for example, the input sensor IS may sense a signal by being implemented in a mutual capacitance manner.

In an embodiment, the driving chip DIC is displayed on the display panel DP. The driving chip DIC may be mounted on the display panel DP. The driving chip DIC may be electrically connected to the display panel DP and provide the display panel DP with an electrical signal for driving the display panel DP.

The circuit module FTC is electrically connected to the input sensor IS. In an embodiment, the circuit module FTC may include a circuit board FCB and a driving circuit chip TIC. The circuit board FCB may be a flexible circuit board. The driving circuit chip TIC may be mounted, in the form of a chip-on-film, on the circuit board FCB. Although not illustrated, the circuit module FTC may connect the input sensor IS and the display panel DP to each other.

In an alternative embodiment of the invention, the driving circuit chip TIC may be omitted, and the circuit module FTC may include only the circuit board FCB. In an embodiment of the invention, a driving circuit chip TIC may be mounted on another electronic component. In another alternative embodiment of the invention, a driving circuit of the driving circuit chip TIC may not be mounted on the circuit board FCB, but may be integrated with the driving chip DIC.

In an embodiment of the invention, the circuit board FCB may not be connected to the display panel DP, but may be connected to another circuit board (hereinafter, a main circuit board). The driving circuit chip TIC may be mounted on a main circuit board which is not illustrated. The display panel DP may be connected to the main circuit board through a flexible circuit board which is not illustrated.

The active region AA may include a first region A1 and a second region A2. The first region A1 may overlap or correspond to the sensing region ED-SA (FIG. 1A) of the electronic device ED. In an embodiment, the first region A1 may be illustrated in a circular shape, but may have various shapes such as a polygon, an oval, and a shape having at least one curved side, or an irregular shape and may not be limited to one embodiment. The first region A1 may be referred to as a component region, and the second region A2 may be referred to as a main display region or a general display region.

In an embodiment, the first region A1 may have a higher transmittance than the second region A2. In an embodiment, the resolution of the first region A1 may be lower than that of the second region A2. The first region A1 may overlap a camera module CMM to be described later.

The display module DM may include the driving chip DIC disposed on the non-display region DP-NDA. The driving chip DIC may be provided in the form of an integrated chip.

The driving chip DIC may include driving elements for driving pixels of the display panel DP, for example, a data driving circuit. FIG. 2A illustrates an embodiment having a structure in which the driving chip DIC is mounted on the display panel DP. However, an embodiment of the invention is not limited thereto. In an alternative embodiment, for example, the driving chip DIC may be mounted on a flexible circuit board that is separately provided. Alternatively, the driving chip DIC may be mounted on the main circuit board.

The power module PM supplies power used for the overall operation of the electronic device ED. The power module PM may include a typical battery module.

The first electronic module EM1 and the second electronic module EM2 each include various functional modules for operating the electronic device ED. Each of the first electronic module EM1 and the second electronic module EM2 may be directly mounted on a mother board electrically connected to the display panel DP or mounted on a separate board to be electrically connected to a mother board through a connector (not illustrated).

The first electronic module EM1 may include a control module CM, a wireless communication module TM, an image input module IIM, a sound input module AIM, a memory MM, and an external interface IF.

The control module CM controls the overall operation of the electronic device ED. The control module CM may be a microprocessor. In an embodiment, for example, the control module CM activates or deactivates the display panel DP. The control module CM may control other modules such as an image input module IIM or a sound input module AIM on the basis of a touch signal received from the display panel DP.

The wireless communication module TM may communicate with an external electronic device through a first network (e.g., a short-range communication network such as Bluetooth®, Wi-Fi direct® or infrared data association ("IrDA")) or a second network (e.g., a long-range communication network such as a cellular network, Internet, or a computer network (e.g., LAN or WAN)). Communication modules included in the wireless communication module TM may be integrated into one component (e.g., a single chip), or may be implemented as a plurality of components separate from each other (e.g., a plurality of chips). The wireless communication module TM may transmit/receive a voice signal using a general communication line. The wireless communication module TM may include a transmission unit TM1 that modulates and transmits a signal to be transmitted, and a reception unit TM2 that demodulates the received signal.

The image input module IIM processes an image signal and coverts the same into image data that is displayable on the display panel DP. The sound input module AIM receives an external sound signal through a microphone in a recording mode, a sound recognition mode, and the like, and converts the received sound signal into electrical voice data.

The external interface IF may include a connector that may physically connect an electronic device ED and an external electronic device to each other. In an embodiment, for example, the external interface IF functions as an interface which is connected to an external charger, a wired/wireless data port, a card socket (e.g., a memory card, a SIM/UIM card), etc.

The second electronic module EM2 may include a sound output module AOM, a light-emitting module LTM, a light-receiving module LRM, and a camera module CMM. The sound output module AOM converts sound data received from the wireless communication module TM or sound data stored in the memory MM, and outputs the converted sound data to the outside.

The light-emitting module LTM generates and outputs light. The light-emitting module LTM may output infrared rays. The light-emitting module LTM may include an LED element. The light-receiving module LRM may sense infrared rays. The light-receiving module LRM may be activated when a predetermined level of infrared rays is sensed. The light-receiving module LRM may include a CMOS sensor. After the infrared rays generated from the light-emitting module LTM are output, the output infrared rays are reflected by an external object (e.g., a user's finger or face) and the reflected infrared rays may be incident on the light-receiving module LRM.

The camera module CMM may capture a still image or a moving image. The camera module CMM may be provided in plurality. At least a portion of the camera modules CMMs may overlap the first region A1. An external input (e.g., light) may be provided to the camera module CMM through the first region A1. For example, the camera module CMM may capture an external image by receiving natural light through the first region A1.

The housings EDC1 and EDC2 accommodate a display module DM, first and second electronic modules EM1 and EM2, and a power module PM. The housings EDC1 and EDC2 protect components accommodated therein, for example, the display module DM, the first and second electronic modules EM1 and EM2, and the power module PM. In an embodiment, as show in FIG. 2A, the housings EDC1 and EDC2 may include two separate housings EDC1 and EDC2. However, an embodiment of the invention is not limited thereto. Although not illustrated, the electronic device ED may further include a hinged structure for connecting the two housings EDC1 and EDC2 to each other. The housings EDC1 and EDC2 may be coupled to the window module WM.

Figure 3:
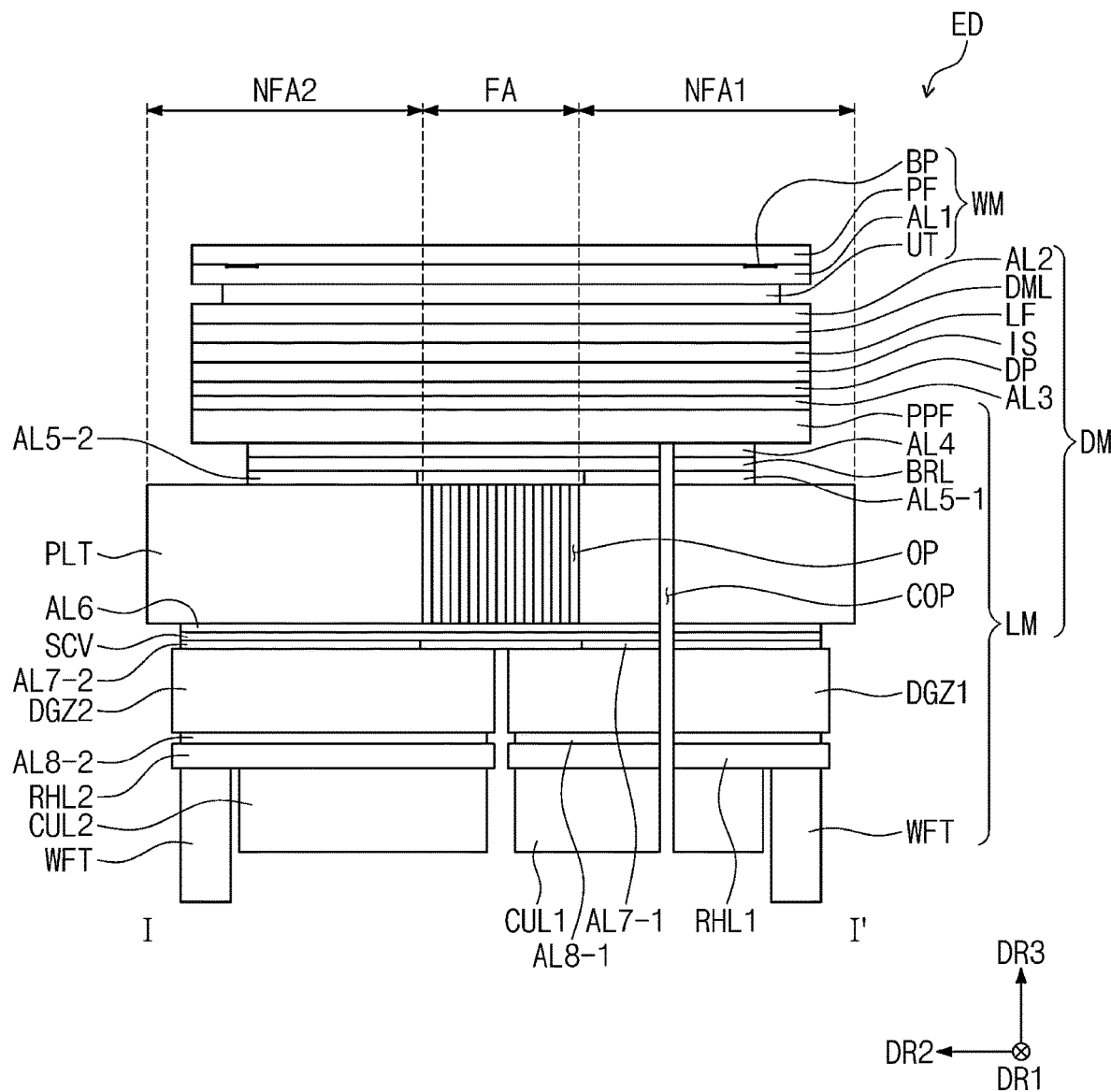
FIG. 3 is a cross-sectional view of an electronic device according to an embodiment of the invention.

FIG. 3 is a cross-sectional view of an electronic device ED taken along line I-I' of FIG. 2A according to an embodiment of the invention. In FIG. 3, configurations of the window module WM and the display module DM in the structure of the electronic device ED illustrated in FIG. 2A are illustrated in detail, and configurations of the circuit module FTC, the first electronic module EM1, the second electronic module EM2, the power module PM, and the housings EDC1 and EDC2 are not illustrated and omitted, for convenience of illustration.

Referring to FIG. 3, an embodiment of the electronic device ED may include a window module WM and a display module DM.

The window module WM may include a window UT, a protective film PF disposed on the window UT, and a bezel pattern BP.

The window UT may be chemically strengthened glass. The application of the window UT to the electronic device ED may minimize the occurrence of corrugation even when the electronic device ED is folded and unfolded repeatedly.

The protective film PF may include polyimide, polycarbonate, polyamide, triacetylcellulose, or polymethylmethacrylate or polyethylene terephthalate. Although not illustrated separately, at least one selected from a hard coating layer, an anti-fingerprint layer, and an anti-reflection layer may be disposed on an upper surface of the protective film PF.

The bezel pattern BP overlaps the non-display region NDA illustrated in FIG. 1A. The bezel pattern BP may be disposed on one surface of the window UT or one surface of the protective film PF. FIG. 3 illustrates an embodiment where the bezel pattern BP is disposed on a lower surface of the protective film PF, for example. However, an embodiment of the invention is not limited thereto, and alternatively, the bezel pattern BP may be disposed on an upper surface of the protective film PF, an upper surface of the window UT, or a lower surface of the window UT. The bezel pattern BP is a colored light-shielding layer. In an embodiment, for example, the bezel pattern BP may be prepared by a coating method. The bezel pattern BP may include a base material and a dye or pigment mixed with the base material. The bezel pattern BP may be provided, on a plane, in a closed line shape.

A first adhesive layer AL1 may be disposed between the protective film PF and the window UT. The first adhesive layer AL1 may be a pressure sensitive adhesive ("PSA") film or an optically clear adhesive ("OCA") member. Adhesive layers to be described below may also be the same as the first adhesive layer AL1 and may include a typical adhesive.

The first adhesive layer AL1 may have a thickness which is sufficient to cover the bezel pattern BP. In an embodiment, for example, a thickness of the bezel pattern BP may be in a range of about 3 micrometers to about 8 micrometers, and the first adhesive layer AL1 may have a thickness which is sufficient to prevent bubbles from being generated in the peripheral region of the bezel pattern BP.

The first adhesive layer AL1 may be separated from the window UT. The protective film PF has lower rigidity than the window UT, and thus, scratches may occur in the protective film PF with relative ease. After separating the adhesive layer AL1 and a damaged protective film PF from the window UT, a new protective film PF may be attached to the window UT.

The display module DM may include a shock absorbing layer DML, a display panel DP, and a lower member LM. An input sensor IS and an anti-reflection layer LF may be disposed between the shock absorbing layer DML and the display panel DP. The input sensor IS may be directly disposed on the display panel DP, and the anti-reflection layer LF may be directly disposed on the input sensor IS. The input sensor IS and the anti-reflection layer will be described later in greater detail.

The shock absorbing layer DML may be disposed on the display panel DP. The shock absorbing layer DML may be a functional layer for protecting the display panel against external shock. The shock absorbing layer DML may be bonded to the window UT through the second adhesive layer AL2. The shock absorbing layer DML may be directly disposed on the anti-reflection layer LF. However, an embodiment of the invention is not limited thereto, and an adhesive layer may be disposed between the shock absorbing layer DML and the anti-reflection layer LF.

In an embodiment, the display module DM may have, as an anti-reflection layer LF to be described later, a structure which has a plurality of color filters 320 and a division layer 310, in place of an existing polarization film. Since the anti-reflection layer LF does not include a polarization film, shock intensity may be reduced. However, shock intensity may be increased through the shock absorbing layer DML disposed on the anti-reflection layer LF, thereby preventing a display panel DP disposed below the shock absorbing layer DML against external shock.

The lower member LM may be disposed below the display panel DP. The lower member LM may be bonded to the display panel DP through a third adhesive layer AL3. The lower member LM may include a panel protective layer PPF, a barrier layer BRL, a support layer PLT, a cover layer SCV, a first digitizer DGZ1, a second digitizer DGZ2, a first lower plate RHL1, a second lower plate RHL2, a first cushion layer CUL1, a second cushion layer CUL2, and a water-proofing tape WFT. In an embodiment of the invention, the lower member LM may not include some of the above-mentioned components, or include other components. FIG. 3 shows a stack sequence of components in an embodiment, and a stack sequence of each of components may be variously modified.

The panel protective layer PPF may be disposed below the display panel DP. The third adhesive layer AL3 may bond the panel protective layer PPF and the display panel DP. The panel protective layer PPF may protect a lower portion of the display panel DP. The panel protective layer PPF may include a flexible plastic material. The panel protective layer PPF may prevent a scratch from occurring on a rear surface of the display panel DP during a manufacturing process of the display panel DP. The panel protective layer PPF may be a colored polyimide film. In an embodiment, for example, the panel protective layer PPF may be an opaque yellow film, but may not be limited thereto.

The barrier layer BRL may be disposed below the panel protective layer PPF. A fourth adhesive layer AL4 may be disposed between the panel protective layer PPF and the barrier layer BRL to bond the barrier layer BRL to the panel protective layer PPF. The barrier layer BRL may increase resistance against compression caused by external pressing. Thus, the barrier layer BRL may function to prevent deformation of the display panel DP. The barrier layer BRL may include a flexible plastic material such as polyimide or polyethylene terephthalate.

In an embodiment, the barrier layer BRL may absorb light incident from the outside. The barrier layer BRL may include a light-shielding material or may be a colored film having a low light transmittance. In an embodiment, for example, the barrier layer BRL may be a black plastic film, for example, a black polyimide film. When the display module DM is viewed from above the window module WM, components disposed below the barrier layer BRL may be invisible to a user.

The support layer PLT is disposed below the barrier layer BRL. The support layer PLT supports components disposed thereon, and keeps the electronic device ED in an unfolded state and a folded state. In an embodiment of the invention, the support layer PLT may include at least a first support portion corresponding to the first non-folding region NFA1, a second support portion corresponding to the second non-folding region NFA2, and a folding portion corresponding to the folding region FA. The first support portion and the second portion may be spaced apart from each other in the second direction DR2. The folding portion may be disposed between the first support portion and the second support portion, and a plurality of openings OP may be defined in the folding portion. The flexibility of a portion of the support layer PLT may be enhanced by the openings OP. The flexibility of a portion, overlapping the folding region FA, in the support layer PLT may be enhanced by the openings OP.

The support layer PLT may include carbon fiber reinforced plastic ("CFRP"), but may not be particularly limited thereto. In an embodiment, the first support portion and the second support portion may include a non-metal material, plastic, glass fiber reinforced plastic or glass. The plastic may include polyimide, polyethylene, or polyethylene terephthalate, but may not be particularly limited thereto. The first support portion and the second support portion may include the same material. The folding portion may include a material which is the same as those of the first and second support portions, or may include a material different from those of the first and second support portions. In an embodiment, for example, the folding portion may include a material having a modulus of elasticity of about 60 gigapascals (GPa) or more or a metal material such as stainless-steel. In an embodiment, for example, the folding portion may include SUS304 stainless steel. However, an embodiment of the invention is not limited thereto, and the folding portion may include various metal materials.

Fifth adhesive layers AL5-1 and AL5-2 may be disposed between the barrier layer BRL and the support layer PLT. Sixth adhesive layers AL6-1 and AL6-2 may bond the barrier layer BRL to the support layer PLT. On a plane, the fifth adhesive layers AL5-1 and AL5-2 may not overlap the plurality of openings OP. In such an embodiment, on a plane, the fifth adhesive layers AL5-1 and AL5-2 may be spaced apart from the plurality of openings OP.

Each of the fifth adhesive layers AL5-1 and AL5-2 may include a first portion AL5-1 and a second portion AL5-2 spaced apart from each other. The first portion AL5-1 and the second portion AL5-2 may be spaced apart from each other with the plurality of openings disposed therebetween. The first portion AL5-1 may overlap the first non-folding region NFA1, the second portion AL5-2 may overlap the second non-folding region NFA2, and each of the first portion AL5-1 and the second portion AL5-2 may not overlap the folding region FA. The fifth adhesive layers AL5-1 and AL5-2 may not be disposed in a region corresponding to the folding region FA, and thus, the flexibility of the support layer PLT may be enhanced.

In a region overlapping the folding region FA, the barrier layer BRL may be spaced apart from the support layer PLT. That is, in a portion overlapping the folding region FA, an empty space may be defined between the support layer PLT and the barrier layer BRL.

When the electronic device ED (FIG. 1A) is folded, an empty space is defined between the barrier layer BRL and the support layer PLT. Thus, the shapes of the plurality of openings OP defined in the support layer PLT may be invisible from the outside of the electronic device ED (FIG. 1A).

In an embodiment, the barrier layer BRL may include a light-shielding material or may be provided using a colored film having a low light transmittance, and thus, a color difference in the support layer PLT may be invisible to the outside. In an embodiment, for example, at the support layer PLT, a color difference between the first support region in which the plurality of openings OP are defined and the second support region in which the plurality of openings OP are not defined, may be invisible to the outside. The first support region may be a region overlapping the folding region FA, and the second support region may be a region overlapping the first non-folding region NFA1 and the second folding region NFA2.

Each of the fifth adhesive layers AL5-1 and AL5-2 may be thinner than the fourth adhesive layer AL4. In an embodiment, for example, the fourth adhesive layer AL4 may have a thickness of about 25 micrometers, and each of the fifth adhesive layers AL5-1 and AL5-2 may have a thickness of about 16 micrometers.

A sixth adhesive layer AL6 may be disposed below the support layer PLT, and the cover layer SCV may be disposed below the sixth adhesive layer AL6. The support layer PLT and the cover layer SCV may be bonded to each other by the sixth adhesive layer AL6. The cover layer SCV may be manufactured in the form of a sheet to be attached to the support layer PLT.

The sixth adhesive layer AL6 and the cover layer SCV may cover the plurality of openings OP defined in the support layer PLT. Thus, the cover layer SCV may prevent foreign matter from being introduced into the plurality of openings OP. The cover layer SCV may have a modulus of elasticity which is lower than that of the support layer PLT. In an embodiment, for example, the cover layer SCV may include at least one selected from thermoplastic polyurethane, rubber, and silicone, but may not be limited thereto.

Seventh adhesive layers AL7-1 and AL7-2 may be disposed below the cover layer SCV. The seventh adhesive layers AL7-1 and AL7-2 may include a first portion AL7-1 and a second portion AL7-2. The first portion AL7-1 and the second portion AL7-2 may be spaced apart from each other. On a plane, the first portion AL7-1 and the second portion AL7-2 may be spaced apart from each other with the plurality of openings OP disposed therebetween. In the folding region FA, the first portion AL7-1 and the second portion AL7-2 may not overlap each other.

The first digitizer DGZ1 and the second digitizer DGZ2 may be disposed below the first portion AL7-1 and the second portion AL7-2, respectively. The first digitizer DGZ1 may be attached to the first portion AL7-1, and the second digitizer DGZ2 may be attached to the second portion AL7-2. The first digitizer DGZ1 and the second digitizer DGZ2 are spaced apart from each other with a predetermined gap disposed therebetween. The gap may be disposed to correspond to the folding region FA. On a plane, one portion of the first digitizer DGZ1 may overlap one portion of the plurality of openings OP, and one portion of the second digitizer DGZ2 may overlap the other portion of the plurality of openings OP.

Each of the first and second digitizers DGZ1 and DGZ2 may include a plurality of loop coils which generate a magnetic field of a preset resonance frequency with an electronic pen. The first and second digitizers DGZ1 and DGZ2 may be referred to as EMR sensing panels.

A magnetic field generated by the first and second digitizers DGZ1 and DGZ2 is applied to an LC resonance circuit of the pen, which includes an inductor (coil) and a capacitor. The coil generates an electric current using the received magnetic field, and transmits the generated electric current to the capacitor. Thus, the capacitor charges the electric current input from the coil and discharges the charged electric current to the coil. As a result, the magnetic field of a resonance frequency is discharged to the coil. The magnetic field discharged by the pen may be re-absorbed by the loop coils of the digitizers such that position of the first and second digitizers DGZ1 and DGZ2 which the pen is adjacent to is determined.

Eighth adhesive layers AL8-1 and AL8-2 may be disposed below the first digitizer DGZ1 and the second digitizer DGZ2, respectively. The eighth adhesive layers AL8-1 and AL8-2 may include a first portion AL8-1 and a second portion AL8-2. The first portion AL8-1 and the second AL8-2 may be separated from each other.

The first lower plate RHL1 and the second lower plate RHL2 may be disposed below the first portion AL8-1 and the second portion AL8-2, respectively. The first lower plate RHL1 and the second lower plate RHL2 may protect components thereon against external pressure. The first lower plate RHL1 and the second lower plate RHL2 may include SUS316 stainless steel. However, an embodiment of the invention is not particularly limited thereto.

A first cushion layer CUL1 and a second cushion layer CUL2 may be disposed below the first lower plate RHL1 and the second lower plate RHL2, respectively. The first cushion layer CUL1 and the second cushion layer CUL2 may protect the display panel DP by absorbing external shock. Each of the first cushion layer CUL1 and the second cushion layer CUL2 may include a foam sheet having a predetermined magnitude of elastic force. The first cushion layer CUL1 and the second cushion layer CUL2 may each include sponge or polyurethane.

The water-proofing tape WFT may be attached to each of the first lower plate RHL1 and the second lower plate RHL2. In an embodiment, for example, the water-proofing tape WFT may be disposed on an edge of each of the first cushion layer CUL1 and the second cushion layer CUL2. The water-proofing tape WFT may be attached to a set bracket (not illustrated). The water-proofing tape WFT may be thicker than each of the first cushion layer CUL1 and the second cushion layer CUL2. Even when the electronic device ED (FIG. 2a) is immersed in water, a risk of the driving chip DIC (FIG. 2A) being immersed in water may be reduced by the water-proofing tape WFT.

A through-hole COP may be defined in at least a portion of components constituting the lower member LM. The through-hole COP may overlap with or correspond to the sensing region ED-SA (FIG. 1A) of the electronic device ED. At least a portion of the camera module CMM (FIG. 2A) may be inserted into the through-hole COP.

Figure 4:
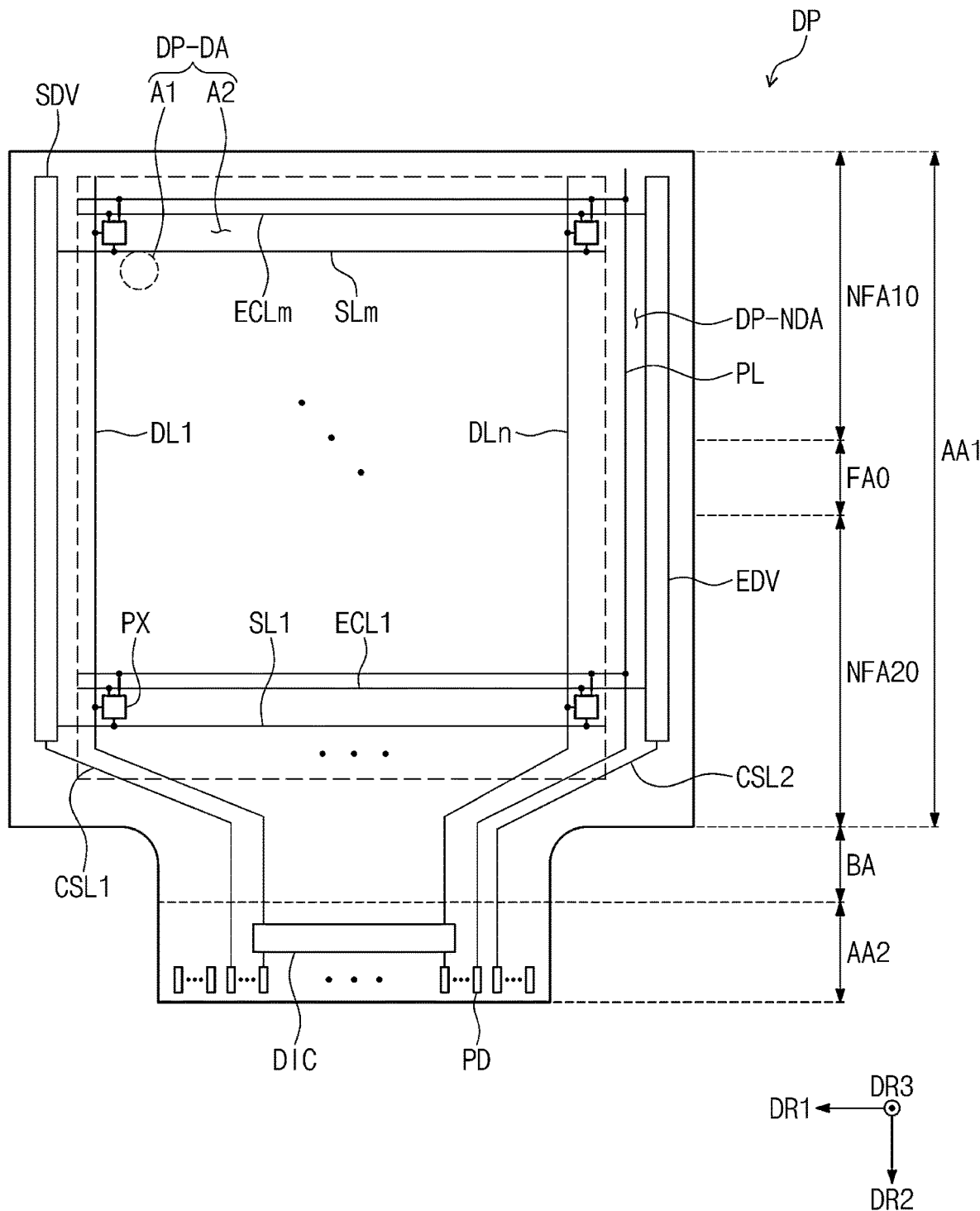
FIG. 4 is a plan view of a display panel according to an embodiment of the invention.

FIG. 4 is a plan view of the display panel DP according to an embodiment of the invention.

Referring to FIG. 4, in an embodiment, a display region DP-DA and a non-display region DP-NDA around the display region DP-DA may be defined in the display panel DP. The display region DP-DA and the non-display region DP-NDA may be distinguished from each other based on whether pixels PX are disposed thereon. The pixels PX are disposed in the display region DP-DA. A scan driving unit SDV, a data driving unit, and a light-emitting driving unit EDV may be disposed in the non-display region DP-NDA. The data driving unit may be a portion of a circuit included in the driving chip DIC.

The display region DP-DA may include a first region A1 and a second region A2. The first region A1 and the second region A2 may be distinguished from each other based on an arrangement interval of the pixels PX, a size of each pixel PX, or whether a transmissive region exists. In an embodiment, as described above, the first region A1 may be a portion overlapping the camera module CMM (FIG. 2A). The first region AL may have a higher transmittance than the second region A2. In an embodiment, the resolution of the first region A1 may be lower than that of the second region A2. In an embodiment, the first region A1 may have a smaller number of pixels per unit area and a large transmissive region compared to the second region A2, and thus have a high transmittance and low resolution. In an embodiment, a transmissive hole may be defined through the display panel DP in the first region A1.

The display panel DP may include a first panel region AA1, a bending region BA, and a second panel region AA2 defined in the second direction DR2. The second panel region AA2 and the bending region BA may be portions of the non-display region DP-NDA. The bending region BA is disposed between the first panel region AA1 and the second panel region AA2.

The first panel region AA1 is a region corresponding to the display surface DS of FIG. 1A. The first panel region AA1 may include a first non-folding region NFA10, a second non-folding region NFA20, and a folding region FAO. The first non-folding region NFA10, the second non-folding region NFA20, and the folding region FAO respectively correspond to the first non-folding region NFA1, the second non-folding region NFA2, and the folding region FA of FIG. 1A and FIG. 1B.

A width of the bending region BA and a width (length) of the second panel region AA2, in the first direction DR1, may be smaller than a width (or a length) of the first panel region AA1 in the first direction DR1. A region having a shorter length in a bending-axis direction may be bent more easily.

The display panel DP may include a plurality of pixels PX, a plurality of scan lines SL1 to SLm, a plurality of data lines DL1 to DLn, a plurality of light-emitting control lines ECL1 to ECLm, first and second control lines CSL1 and CSL2, a driving voltage line PL, and a plurality of pads PD. Here, m and n are natural numbers. The pixels PX may be connected to the scan lines SL1 to SLm, the data lines DL1 to DLn, and the light-emitting control lines ECL1 to ECLm.

The scan lines SL1-SLm may extend in the first direction DR1 to be electrically connected to the scan driving unit SDV. The data lines DL1 to DLn may extend in the second direction DR2 to be electrically connected to the driving chip DIC via the bending region BA. The light-emitting control lines ECL1 to ECLm may extend in the first direction DR1 to be electrically connected to the light-emitting driving unit EDV.

The driving voltage line PL may include a portion extending in the first direction DR1 and a portion extending in the second direction DR2. The portion extending in the first direction DR1 and the portion extending in the second direction DR2 may be disposed on different layers. A portion, of the driving voltage line PL, extending in the second direction DR2, may extend towards the second panel region AA2 via the bending region BA. The driving voltage line PL may provide a first voltage to the pixels PX.

A first control line CSL1 may be connected to the scan driving unit SDV and extend towards a lower end of the second panel region AA2 via the bending region BA. A second control line CSL2 may be connected to the light-emitting driving unit EDV and extend towards a lower end of the second panel region AA2 via the bending region BA.

When viewed in a plan view, the pads PD may be disposed adjacent to the lower end of the second panel region AA2. The driving chip DIC, the driving voltage line PL, the first control line CSL1, and the second control line CSL2 may be electrically connected to the pads PD. The pads PD may be electrically connected to a flexible circuit board which is not illustrated. A flexible circuit film may be electrically connected to the pads PD through the anisotropic conductive adhesive layer.

Figure 5A:
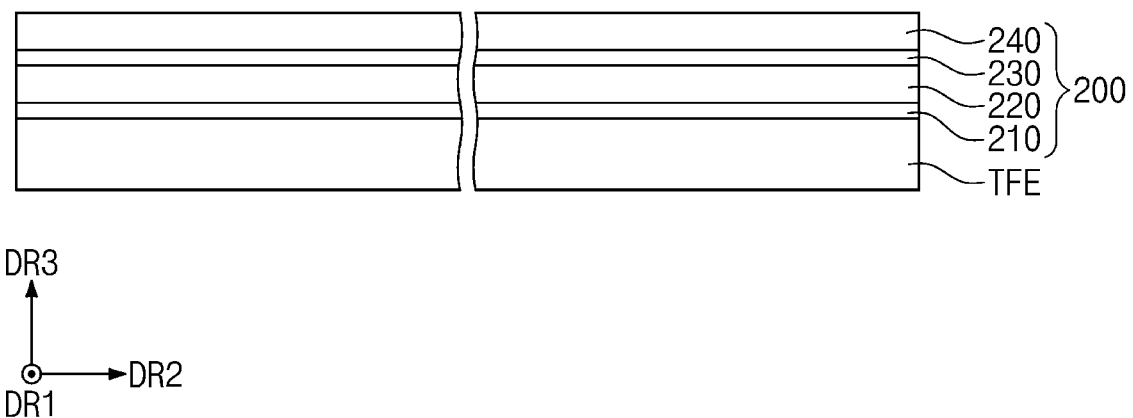
FIG. 5A is a cross-sectional view of an input sensor according to an embodiment of the invention.
Figure 5B:
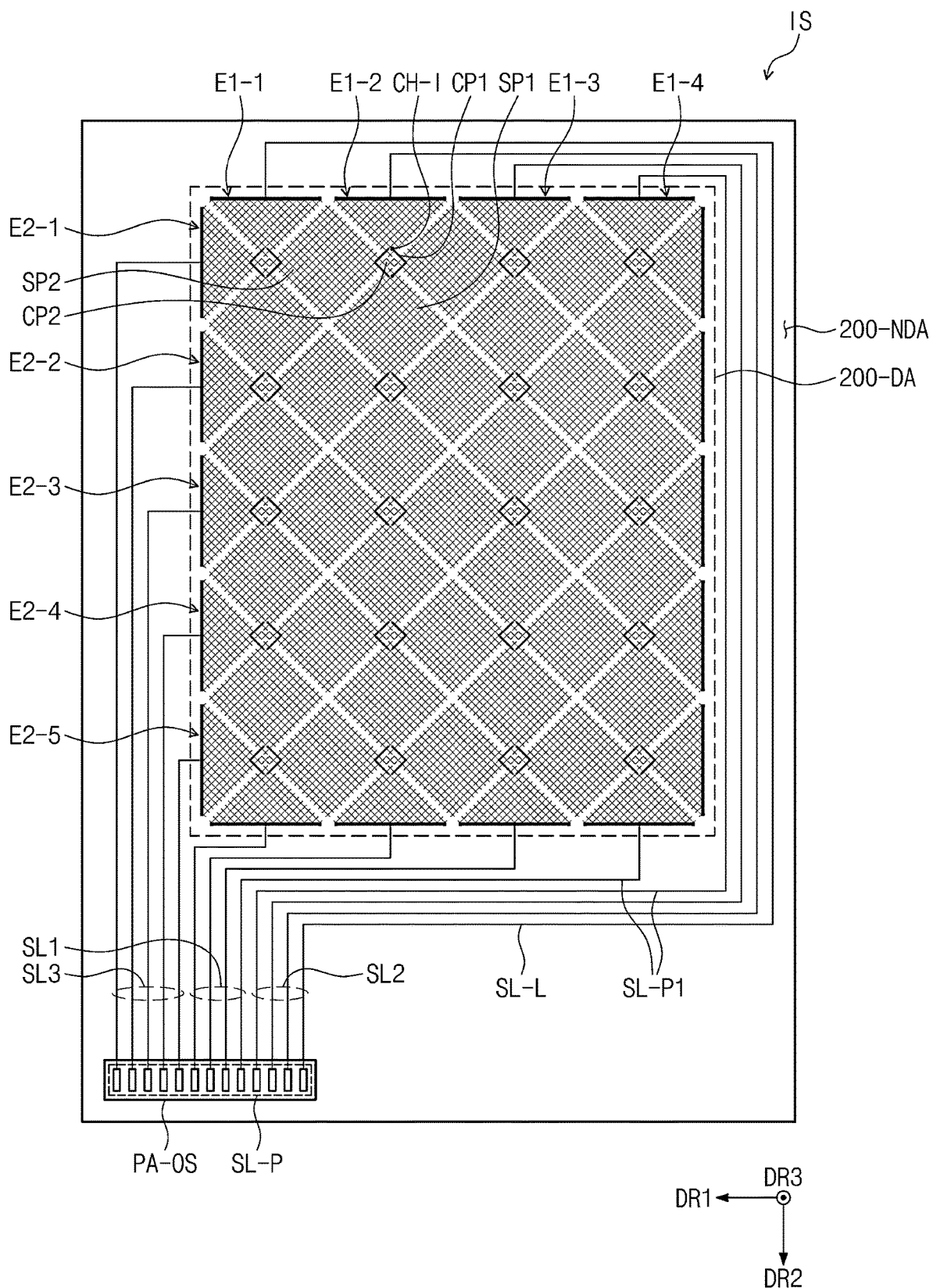
FIG. 5B is a plan view of an input sensor according to an embodiment of the invention.

FIG. 5A is a cross-sectional view of the input sensor IS according to an embodiment of the invention. FIG. 5B is a plan view of the input sensor IS according to an embodiment of the invention.

Referring to FIG. 5A, the input sensor IS may include a first insulating layer 210 (or a sensor base layer), a first conductive layer 220, a second insulating layer 230 (or a sensing insulating layer), and a second conductive layer 240. The first insulating layer 210 may be disposed directly on an encapsulation layer TFE to be described later. Although not illustrated, the input sensor IS may further include a third insulating layer (or a cover insulating layer) disposed on the second conductive layer 240. The third insulating layer may be replaced with an adhesive layer or an insulating layer of the anti-reflection layer LF disposed on the input sensor IS.

In an alternative embodiment, the first insulating layer 210 may be omitted. In such an embodiment where the first insulating layer 210 is omitted, the first conductive layer 220 may be disposed on an uppermost insulating layer of the encapsulation layer TFE.

The first conductive layer 220 may include first conductive patterns, and the second conductive layer 240 may include second conductive patterns. Hereinafter, the first conductive layer 220 and the second conductive patterns are denoted as the same reference numerals or symbols as each other, and the second conductive layer 240 and the second conductive patterns are denoted as the same reference numerals or symbols as each other.

Each of the first conductive layer 220 and the second conductive layer 240 may have a single-layered structure or a multi-layered structure in which layers are stacked in the third direction DR3. A conductive pattern of the multi-layered structure may include at least two among transparent conductive layers and metal layers. The conductive pattern of the multi-layered structure may include metal layers including different metals. The transparent conductive layer may include at least one selected from indium tin oxide ("ITO"), indium zinc oxide ("IZO"), zinc oxide (ZnO), indium tin zinc oxide ("ITZO"), poly(3,4-ethylenedioxythiophene) ("PEDOT"), a metal nanowire, and graphene. The metal layer may include at least one selected from molybdenum, chromium, nickel, silver, titanium, copper, aluminum, and an alloy thereof. A stack structure of each of the first conductive layer 220 and the second conductive layer 240 will be described in detail later.

In an embodiment, the first insulating layer 210 and the second insulating layer 230 may each include an inorganic layer or an organic layer. In an embodiment, the first insulating layer 210 and the second insulating layer 230 may each include an inorganic layer. The inorganic layer may include silicon oxide, silicon nitride, or silicon oxynitride.

In an embodiment of the invention, at least one selected from the first insulating layer 210 and the second insulating layer 230 may be an organic layer. The organic layer may include at least one selected from an acrylic resin, a methacrylic resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

Referring to FIG. 5B, the input sensor IS may include a plurality of sensing electrodes E1-1 to E1-5 and E2-1 to E2-4 and a plurality of signal lines SL1, SL2, and SL3 connected to the plurality of sensing electrodes SE1 and SE2.

The input sensor IS includes a sensing region 200-DA and a non-sensing region adjacent to the sensing region 200-DA. The sensing region 200-DA and the non-sensing region 200-NDA correspond to the display region DA (FIG. 1A) and the non-display region NDA (FIG. 1A), respectively.

The input sensor IS disposed in the sensing region 200-DA, and includes first sensing electrodes E1-1 to E1-4 and second sensing electrodes E2-1 to E2-5, which are insulated from each other and disposed to cross each other. The input sensor IS disposed in the non-sensing region 200-NDA, and includes first signal lines SL1 and second signal lines SL2 electrically connected to the first sensing electrodes E1-1 to E1-4, and third signal lines SL3 electrically connected to the second sensing electrodes E2-1 to E2-5. The first sensing electrodes E1-1 to E1-4, the second sensing electrodes E2-1 to E2-5, the first signal lines SL1, the second signal lines SL2, and the third signal lines SL3 may be defined through the combination of the first conductive layer 220 and the second conductive layer 240 described with reference to FIG. 5A.

The first sensing electrodes E1-1 to E1-4 and the second sensing electrodes E2-1 to E2-5 may each include a plurality of conductive lines crossing each other. The plurality of conductive lines may define a plurality of openings, and the first sensing electrodes E1-1 to E1-4 and the second sensing electrodes E2-1 to E2-5 may each have a mesh shape. Each of the plurality of openings may be defined corresponding to a light-emitting region of each of the pixels PX of the display panel DP. In such an embodiment where the first sensing electrodes E1-1 to E1-4 and the second sensing electrodes E2-1 to E2-5 each have a mesh shape, a parasitic capacitance between the first sensing electrodes E1-1 to E1-4 and the second sensing electrode E2-1 to E2-5 and electrodes of the display panel DP may be reduced.

The first sensing electrodes E1-1 to E1-4 may extend in the second direction DR2, and may be disposed in the first direction DR1. The second sensing electrodes E2-1 to E2-5 may extend in the first direction DR1 and may be disposed in the second direction DR2.

Either of the first sensing electrodes E1-1 to E1-4 or the second sensing electrodes E2-1 to E2-5 may have an integrated shape. In an embodiment, the second sensing electrodes E2-1 to E2-5 may have an integrated shape. The second sensing electrodes E2-1 to E2-5 may include sensing patterns SP2 and intermediate portions CP2. A portion of the second conductive layer 240 described above may correspond to the second sensing electrodes E2-1 to E2-5.

Each of the first sensing electrodes E1-1 to E1-4 may include sensing patterns SP1 and bridge patterns CP1 (or connection patterns). Two sensing patterns SP1 adjacent to each other may be connected to two bridge patterns CP1 through a contact hole CH-1 defined through the second insulating layer 230, but the number of the bridge patterns may not be limited. A portion of the second conductive layer 240 described above may correspond to the sensing patterns SP1. A portion of the first conductive layer 220 described above may correspond to the bridge patterns CP1. In an embodiment, as shown in FIG. 5B, sensing patterns SP1 and SP2 each may have a rhombus shape, but an embodiment of the invention is not limited thereto. Alternatively, the sensing patterns SP1 and SP2 may have polygonal shapes which are different from each other.

In an embodiment, the bridge patterns CP1 are formed from (or defined by) the first conductive layer 220 illustrated in FIG. 5A, and the second sensing electrodes E2-1 to E2-5 and the sensing patterns SP1 are formed from (or defined by) the second conductive layer 240. However, an embodiment of the invention is not limited thereto. Alternatively, the second sensing electrodes E2-1 to E2-5 and the sensing patterns SP1 may be formed from (or defined by) the first conductive layer 220 illustrated in FIG. 5A, and the bridge patterns CP1 may be formed from (or defined by) the second conductive layer 240.

The signal lines SL1, SL2, and SL3 are disposed on the non-sensing region 200-NDA. The signal lines SL1, SL2, and SL3 include a plurality of first signal lines LS1, a plurality of second signal lines SL2, and a plurality of third signal lines LS3.

The first signal lines SL1 are connected to one-side ends of both ends of the first sensing electrodes E1-1 to E1-4, respectively. The second signal lines SL2 are connected to the other-side ends of both ends of the first sensing electrodes E1-1 to E1-4, respectively. The one-side ends, to which the first signal lines SL1 are connected, among the both ends of the first sensing electrodes E1-1 to E1-4 may mean ends disposed in a relatively proximal position compared to the other-side ends to which the second signal lines SL2 are connected. Hereinafter, one first signal line SL1 and one second signal line SL2 connected to both ends of each of the first sensing electrodes E1-1 to E1-4 are defined as a first line pair SL-P1. The input sensor IS includes first line pairs SL-P1 the number of which corresponds to the number of the first sensing electrodes E1-1 to E1-4.

The third signal lines SL3 are connected to one-side ends of both ends of the second sensing electrodes E2-1 to E2-5, respectively. Although not illustrated, the input sensor IS may further include fourth signal lines connected, respectively, to the other-side ends of the second sensing electrodes E2-1 to E2-5.

Each of the first signal lines SL1, the second signal lines SL2, and the third signal lines SL3 includes a line part SL-L and a pad part SL-P. The pad parts SL-P of the first signal lines SL1, the second signal lines SL2, and the third signal lines SL3 may be aligned in the first direction DR1. In the non-sensing region 200-NDA, a region in which the pad parts SL-P of the first signal lines SL1, the second signal lines SL2, and the third signal lines SL3 are aligned may be defined as a sensor pad region PA-OS.

In an embodiment, as shown in FIG. 5B, a pad part SL-P may have a width different from that of the line part SL-L, but an embodiment of the invention is not limited thereto. Alternatively, the pad part SL-P may have a shape that is integrated with that of the line part SL-L, and the pad part SL-P and the line part SL-L may have a same width as each other.

The first sensing electrodes E1-1 to E1-4 may be transmission electrodes and the second sensing electrodes E2-1 to E2-5 may be reception electrodes, or vice versa. In an embodiment of the invention, the first sensing electrodes E1-1 to EL-4 may be transmission electrodes, and the second sensing electrodes E2-1 to E2-5 may be reception electrodes. The third signal lines SL3 connected to the second sensing electrodes E2-1 to E2-5 may be reception signal lines, and the first signal lines SL1 and the second signal lines SL2 connected to the first sensing electrodes E1-1 to E1-4 may be transmission signal lines.

The input sensor IS may acquire coordinate information by the mutual capacitance method. Capacitances may be formed between the first sensing electrodes E1-1 to E1-4 and the second sensing electrodes E2-1 to E2-5, and the capacitances between the first sensing electrodes E1-1 to E1-4 and the second sensing electrodes E2-1 to E2-5 may be changed by a user's input, for example, a touch input by a hand. In an embodiment, the sensing sensitivity of the input sensor IS may be determined based on an amount of change in capacitance. In such an embodiment, as the amount of change in capacitance by an input becomes greater, the sensing sensitivity of the input sensor IS may be further improved.

A portion of the above-described second conductive layer 240 may correspond to the first signal lines SL1 to the third signal lines SL3. The first signal lines SL1 to the third signal lines SL3 may have a multi-layered structure, and may include a first layer line formed from (or defined by) the first conductive layer 220 and a second layer line formed from (or defined by) the second conductive layer 240. The first layer line and the second layer line may be connected to each other through a contract hole defined through the second insulating layer 230.

Figure 6:
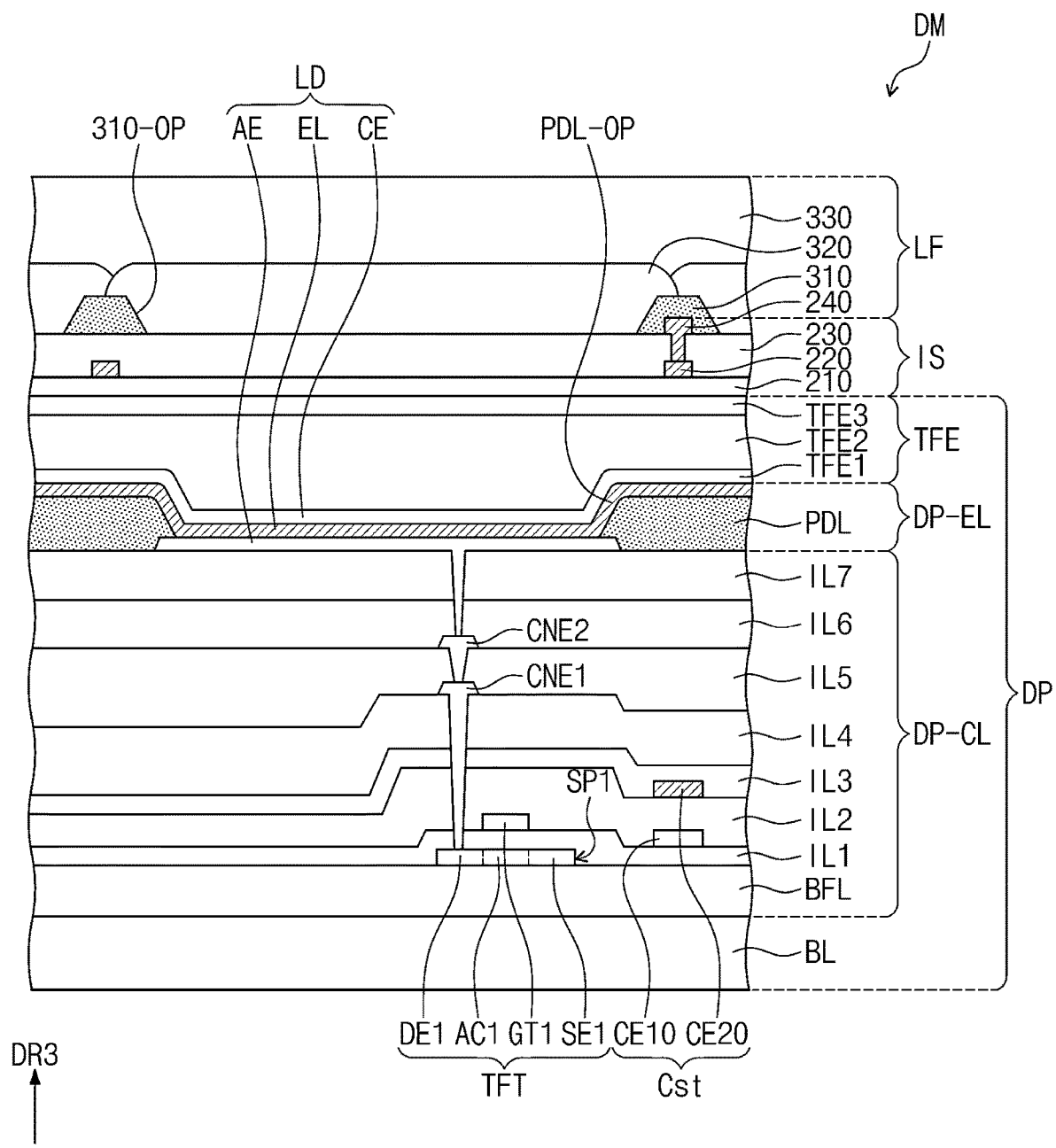
FIG. 6 is a cross-sectional view illustrating a partial configuration of a display module according to an embodiment of the invention.

FIG. 6 is a cross-sectional view illustrating a partial configuration of the display module DM according to an embodiment of the invention. In FIG. 6, components corresponding to one pixel are illustrated in detail for the display panel DP, the input sensor IS, and the anti-reflection layer LF of the display module DM illustrated in FIG. 3.

FIG. 6 illustrates one light-emitting element LD and one transistor TFT. The transistor TFT may be a silicon transistor or an oxide transistor. One pixel may include a plurality of transistors, and one of the plurality of transistors may be an oxide transistor, and an transistor of the plurality of transistors may be a silicon transistor.

A buffer layer BFL may be disposed on the base layer BL. The buffer layer BFL may prevent metal atoms or impurities from diffusing from the base layer BL into a first semiconductor pattern SP1 disposed thereabove. The first semiconductor pattern SP1 includes an active region AC1 of the transistor TFT. The buffer layer BFL may allow the first semiconductor pattern SP1 to be uniformly formed thereon by adjusting a heat supply speed during a crystallization process for forming the first semiconductor pattern SP1.

The first semiconductor pattern SP1 may be disposed on the buffer layer BFL. The first semiconductor pattern SP1 may include a silicon semiconductor. In an embodiment, for example, the silicon semiconductor may include amorphous silicon, polycrystalline silicon, etc. For example, the first semiconductor pattern SP1 may include low-temperature polysilicon. Moreover, the first semiconductor pattern SP1 may include an oxide semiconductor. The first semiconductor pattern SP1 may include a transparent conductive oxide ("TCO") such as ITO, IZO, IGZO, zinc oxide (ZnO) or indium oxide ($In_2O_3$).

FIG. 6 only illustrates a portion of the first semiconductor pattern SP1 disposed on the buffer layer BFL, and the first semiconductor pattern SP1 may be further disposed in another region. The first semiconductor pattern SP1 may be arranged for each pixel according to a specific rule. The electrical properties of the first semiconductor pattern SP1 may vary according to whether the first semiconductor pattern SP1 is doped. The first semiconductor pattern SP1 may include a first region having high conductivity and a second region having low conductivity. The first region may be doped with an N-type dopant or a P-type dopant. A P-type transistor may include a doped region doped with a P-type dopant, and an N-type transistor may include a doped region doped with an N-type dopant. The second region may be an undoped region or may be a region doped at a relatively low concentration compared to the first region.

In an embodiment, the first region has conductivity which is greater than that of the second region, and may substantially function as an electrode or a signal line. The second region may substantially correspond to an active region (or a channel) of a transistor. In such an embodiment, one portion of the first semiconductor pattern SP1 may be an active region of a transistor, another portion may be a source or a drain of the transistor, and still another portion may be a connection electrode or a connection signal line.

A source region SE1 (or a source), an active region AC1 (or a channel), and a drain region DE1 (or a drain) of the transistor TFT may be formed from (or defined by) the first semiconductor pattern SP1. The source region SE1 and the drain region DE1 may extend, on a cross section, in opposite directions from the active region AC1.

The first insulating layer IL1 may be disposed on the buffer layer BFL. The first insulating layer IL1 may commonly overlap a plurality of pixels, and cover the first semiconductor pattern SP1. The first insulating layer IL1 may be an inorganic layer and/or an organic layer, and may have a single-layered or a multi-layered structure. The first insulating layer IL1 may include at least one selected from aluminum oxide, titanium oxide, silicon oxide, silicon nitride, silicon oxynitride, zirconium oxide, and hafnium oxide. In an embodiment, the first insulating layer IL1 may be a single layer of a silicon oxide layer. Not only the first insulating layer IL1 but also an insulating layer of a circuit layer DP-CL to be described later may be an inorganic layer and/or an organic layer, and may have a single-layered or a multi-layered structure. An inorganic layer may include at least one selected from the above-described materials, but may not be limited thereto.

A gate GT1 of a transistor TFT is disposed on the first insulating layer IL1. The gate GT1 may be a portion of a metal pattern. The gate GT1 overlaps the active region AC1. The gate GT1 may function as a mask during a process of doping the first semiconductor pattern SP1. The gate GT1 may include at least one selected from titanium (Ti), silver (Ag), a silver-containing alloy, molybdenum (Mo), a molybdenum-containing alloy, aluminum (Al), an aluminum-containing alloy, aluminum nitride (AlN), tungsten (W), tungsten nitride (WN), copper (Cu), ITO, IZO, etc. However, an embodiment of the invention may not be particularly limited thereto.

The second insulating layer IL2 may be disposed on the first insulating layer IL1, and cover the gate GT1. The third insulating layer IL3 may be disposed on the second insulating layer IL2. A second electrode CE20 of a storage capacitor Cst may be disposed between the second insulating layer IL2 and the third insulating layer IL3. In addition, a first electrode CE10 of the storage capacitor Cst may be disposed between the first insulating layer IL1 and the second insulating layer IL2.

A fourth insulating layer IL4 may be disposed on the third insulating layer IL3. A first connection electrode CNE1 may be disposed on the fourth insulating layer IL4. The first connection electrode CNE1 may be connected to the drain region DE1 of the transistor TFT through a contact hole defined through the first to third insulating layers IL1, IL2, IL3, and IL4.

The fifth insulating layer IL5 may be disposed on the fourth insulating layer IL4. A second connection electrode CNE2 may be disposed on the fifth insulating layer IL5. The second connection electrode CNE2 may be connected to the first connection electrode CNE1 through a contact hole defined through the fifth insulating hole IL4. A sixth insulating layer IL6 may be disposed on the fifth insulating layer IL5, and cover the second connection electrode CNE2. A seventh insulating layer IL7 may be disposed on the sixth insulating layer IL6.

Each of the fifth insulating layer IL5, the sixth insulating layer IL6, and the seventh insulating layer IL7 may be an organic layer. In an embodiment, for example, each of the fifth insulating layer IL5, the sixth insulating layer IL6, and the seventh insulating layer IL7 may include at least one selected from general purpose polymers such as benzocyclobutene ("BCB"), polyimide, hexamethyldisiloxane ("HMDSO"), polymethylmethacrylate ("PMMA") or polystyrene ("PS"), polymer derivatives having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

The light-emitting element LD may include a first electrode AE, a light-emitting layer EL, and a second electrode CE. The second electrode CE may be provided in common on the plurality of light-emitting elements.

The first electrode AE of the light-emitting element LD may be disposed on the seventh insulating layer IL7. The first electrode AE of the light-emitting element LD may be a (semi)transmissive electrode or a reflective electrode. According to an embodiment of the invention, the first electrode AE of the light-emitting element LD may include an anti-reflection layer made of Ag, Mg, Al, Pt, Pd, Au, Ni, Nd, Ir, Cr, or a compound thereof and a transparent or semi-transparent electrode layer disposed on the anti-reflection layer. The transparent or semi-transparent electrode layer may include at least one selected from ITO, IZO, IGZO, zinc oxide (ZnO) or indium oxide ($In_2O_3$), and aluminum-doped zinc oxide ("AZO"). In an embodiment, for example, the first electrode AE of the light-emitting element LD may include a stack structure of ITO/Ag/ITO.

A pixel defining film PDL may be disposed on the seventh insulating layer IL7. The pixel defining film PDL may have light absorption properties. In an embodiment, for example, the pixel defining film PDL may have a black color. The pixel defining film PDL may include a black coloring agent. The black coloring agent may include a black dye and a black pigment. The black coloring agent may include a carbon black, metal (for example, chrome), or an oxide thereof. The pixel defining film PDL may correspond to a light-shielding pattern having a light-shielding property.

The pixel defining film PDL may cover a portion of the first electrode AE of the light-emitting element LD. In an embodiment, for example, an opening PDL-OP which exposes a portion of the first electrode AE of the light-emitting element LD may be defined in the pixel defining film PDL. The pixel defining film PDL may increase a distance between an edge of the first electrode AE and the second electrode CE of the light-emitting element LD. Thus, the pixel defining film PDL may prevent an arc from occurring at the edge of the first electrode AE.

Although not illustrated, a hole control layer may be disposed between the first electrode AE and the light-emitting layer EL. The hole control layer may include a hole transport layer, and may further include a hole injection layer. An electron control layer may be disposed between the light-emitting layer EL and the second electrode CE. The electron control layer may include an electron transport layer, and may further include an electron injection layer. The hole control layer and the electron control layer may be formed in common on a plurality of pixels PX (refer to FIG. 6A) by using an open mask.

The encapsulation layer TFE may be disposed on the light-emitting element layer DP-EL. The encapsulation layer TFE may include an inorganic layer TFE1, an organic layer TFE2, and an inorganic layer TFE3 sequentially stacked, but layers constituting the encapsulation layer TFE may not be limited thereto.

The inorganic layers TFE1 and TFE3 may protect the light-emitting element layer DP-EL against moisture and oxygen, and the organic layer TFE2 may protect the light-emitting element layer DP-EL against foreign substances such as dust particles. The inorganic layers TFE1 and TFE3 may include a silicon nitride layer, a silicon oxynitride layer, a silicon oxide layer, a titanium oxide layer, or an aluminum oxide layer. The organic layer TFE2 may include an acrylic organic layer, but may not be limited thereto.

The input sensor IS may be disposed on the display panel DP. The input sensor IS may be referred to as a sensor, an input sensing layer, or an input sensing panel. The input sensor IS may include a sensor base layer 210, a first conductive layer 220, a sensing insulating layer 230, and a second conductive layer 240.

The sensor base layer 210 may be disposed directly on the display panel DP. The sensor base layer 210 may be an inorganic layer including at least one selected from silicon nitride, silicon oxynitride, and silicon oxide. Alternately, the sensor base layer 210 may be an organic layer including an epoxy resin, an acrylic resin, or an imide-based resin. The sensor base layer 210 may have a single-layered structure, or a multi-layered structure in which layers are stacked in the third direction DR3.

The first conductive layer 220 and the second conductive layer 240 may each have a single-layered structure or a multi-layered structure in which layers are stacked in the third direction DR3. The first conductive layer 220 and the second conductive layer 240 may include conductive lines which define a mesh-shaped sensing electrode. The conductive lines may overlap the pixel defining film PDL without overlapping the opening PDL-OP.

A conductive layer having a single-layered structure may include a metal layer or a transparent conductive layer. The metal layer may include at least one selected from molybdenum, chromium, nickel, silver, titanium, copper, aluminum, and an alloy thereof. The transparent conductive layer may include a TCO such as ITO, IZO, zinc oxide (ZnO), or IZTO. In an embodiment, the transparent conductive layer may include at least one selected from a conductive polymer such as PEDOT, a metal nanowire, and graphene.

A conductive layer having a multi-layered structure may include metal layers sequentially stacked one on another. The metal layers may have, for example, a three-layered structure including titanium/aluminum/titanium. The conductive layer having a multi-layered structure may include at least one metal layer and at least one transparent conductive layer.

The sensing insulating layer 230 may be disposed between the first conductive layer 220 and the second conductive layer 240. The sensing insulating layer 230 may include an inorganic film. The inorganic film may include at least one selected from aluminum oxide, titanium oxide, silicon oxide, silicon nitride, silicon oxynitride, zirconium oxide, and hafnium oxide.

In an embodiment, the sensing insulating layer 230 may include an organic film. The organic film may include at least one selected from an acrylic resin, a methacrylic resin, polyisoprene, a vinyl-based resin, an epoxy-based resin, a urethane-based resin, a cellulose-based resin, a siloxane-based resin, a polyimide-based resin, a polyamide-based resin and a perylene-based resin.

The anti-reflection layer LF may be disposed on the input sensor IS. The anti-reflection layer LF may include a division layer 310, a plurality of color filters 320, and a planarization layer 330.

A material constituting the division layer 310 may not be particularly limited as long as the material is a light-absorbing material. The division layer 310 is a layer having a black color. In an embodiment, the division layer 310 may include a black coloring agent. The black coloring agent may include a black dye and a black pigment. The black coloring agent may include carbon black, a metal (for example, chromium), or an oxide thereof.

The division layer 310 may cover a second conductive layer 240 of the input sensor IS. The division layer 310 may prevent reflection of external light, caused by the second conductive layer 240. In some regions of the display module DM, the division layer 310 may be omitted. One region in which the division layer 310 that is omitted and is not disposed may have a higher transmittance than the other regions.

An opening 310-OP may be defined in the division layer 310. The opening 310-OP may overlap the first electrode AE of the light-emitting element LD. One of the plurality of color filters 320 may overlap the first electrode AE of the light-emitting element LD. One of the plurality of color filters 320 may cover the opening 310-OP. Each of the plurality of color filters 320 may be in contact with the division layer 310.

The planarization layer 330 may cover the division layer 310 and the plurality of color filters 320. The planarization layer 330 may include an organic material, and may have a flat upper surface. In an alternative embodiment of the invention, the planarization layer 330 may be omitted.

Figure 7A:
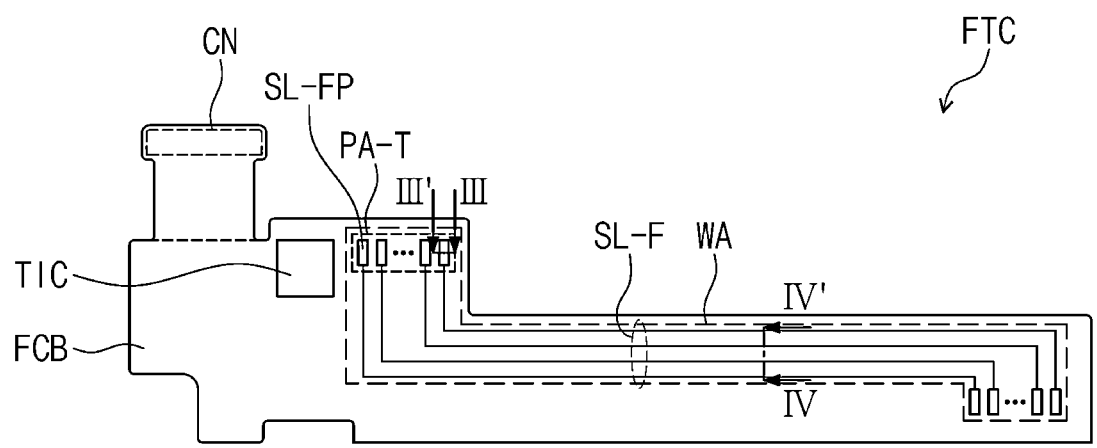
FIGS. 7A and 7B are plan views of a circuit module according to an embodiment of the invention.
Figure 7B:
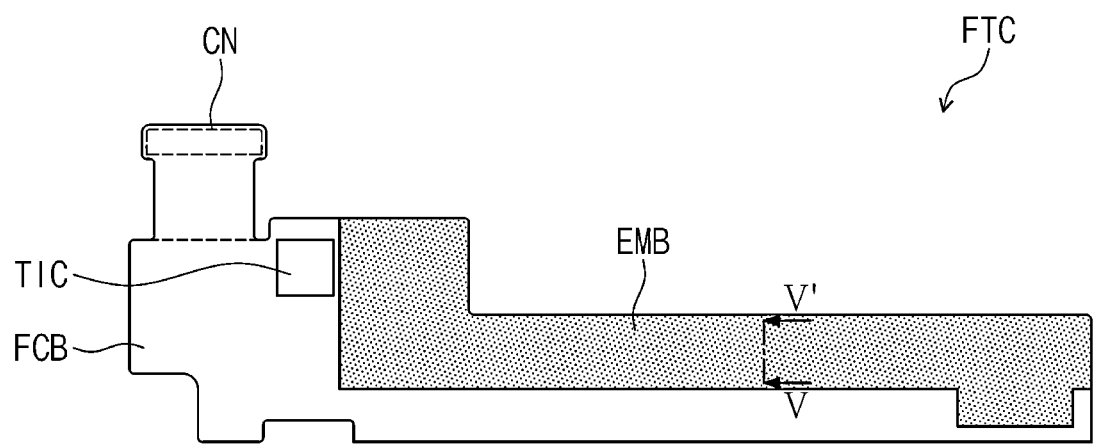

FIGS. 7A and 7B are plan views of a circuit module FTC according to an embodiment of the invention.

In FIG. 7A, for convenience of illustration and description, an electromagnetic shielding layer included in an embodiment of the circuit module FTC is omitted, and FIG. 7B illustrates a planar shape in which the electromagnetic shielding layer EMB is disposed.

Referring concurrently to FIGS. 5B, 7A, and 7B, an embodiment of the circuit module FTC may include a circuit board FCB and a driving circuit chip TIC. The circuit board FCB may be a flexible circuit board. The driving circuit chip TIC may be mounted, in the form of a chip-on-film, on the circuit board FCB.

The circuit board FCB includes a plurality of group signal lines SL-F. The plurality of group signal lines SL-F may include a plurality of circuit pads SL-FP (FIG. 8) disposed on a circuit pad region PA-T and may be electrically connected to the pad part SL-P of the input sensor IS. The group signal lines SL-F may further include a line portion extending from the plurality of circuit pads SL-FP (FIG. 8) disposed on the circuit pad region PA-T. The plurality of circuit pads SL-FP (FIG. 8) electrically connected to the pad part SL-P of the input sensor IS are disposed on one end of the line portion, and a plurality of additional circuit pads (not illustrated) electrically connected to another component may be disposed on the other end of the line portion. In an embodiment, for example, the additional circuit pads may be electrically connected to the main circuit board. In an embodiment, the driving circuit chip TIC may be electrically connected to the additional circuit pads.

In such an embodiment where the plurality of group signal lines SL-F are electrically connected to the pad part SL-P of the input sensor IS through the plurality of circuit pads SL-FP (FIG. 8), at least a portion of the plurality of group signal lines SL-F may be electrically connected to the first signal line SL1 or the second signal line SL2 of the input sensor IS. A portion of the plurality of group signal lines SL-F may be connected to the third signal line SL3 of the input sensor IS. According to an embodiment of the invention, signal lines electrically connected to the first signal line SL1 among the plurality of group signal lines SL-F are defined as a first group signal line SL-F1 (FIG. 9A), and signal lines electrically connected to the second signal line SL2 among the plurality of group signal lines SL-F are defined as a second group signal line SL-F2 (FIG. 9A).

The electromagnetic shielding layer EMB is disposed on the plurality of group signal lines SL-F. The electromagnetic shielding layer EMB may be disposed to overlap a wiring region WA in which at least the plurality of group signal lines SL-F are disposed. The electromagnetic shielding layer EMB may overlap at least a portion of the plurality of group signal lines SL-F. The electromagnetic shielding layer EMB may be disposed to entirely overlap the plurality of group signal lines SL-F.

The electromagnetic shielding layer EMB may provide an electromagnetic shielding function. The electromagnetic shielding layer EMB may stabilize, against external electromagnetic waves, an operating environment of the plurality of group signal lines SL-F disposed therebelow. In an embodiment, the electromagnetic shielding layer EMB may prevent electromagnetic waves generated from some of the plurality of group signal lines SL-F from interfering with another electronic component included in the circuit board FCB or other components disposed adjacent to the electronic device ED (FIG. 2A).

The electromagnetic shielding layer EMB may be provided in the form of a thin film. The electromagnetic shielding layer EMB may include, for example, a metal shielding layer. The metal shielding layer may include a conductive material. In an embodiment, for example, the metal shielding layer may include a copper foil having a predetermined thickness or a deposition layer in which conductive materials such as copper (Cu), gold (Au), and silver (Ag) are deposited. The electromagnetic shielding layer EMB may include an adhesive layer and the like other than the metal shielding layer. The electromagnetic shielding layer EMB may be attached to overlap the plurality of group signal lines SL-F by an adhesive layer including an adhesive material.

The circuit board FCB may further include a connection part CN. The connection part CN may be a portion to which a connector for connecting a test device for testing the electronic device ED (FIG. 2A) is connected. The test device may be electrically connected to the connection part through the connector, and provide a test signal to the circuit board FCB through the connector. A test signal provided to the circuit board FCB from the test device through the connector may be provided to the display panel DP (FIG. 4), and the normal or abnormal operation of the display module DM (FIG. 2A) may be determined based on the test signal.

Figure 8:
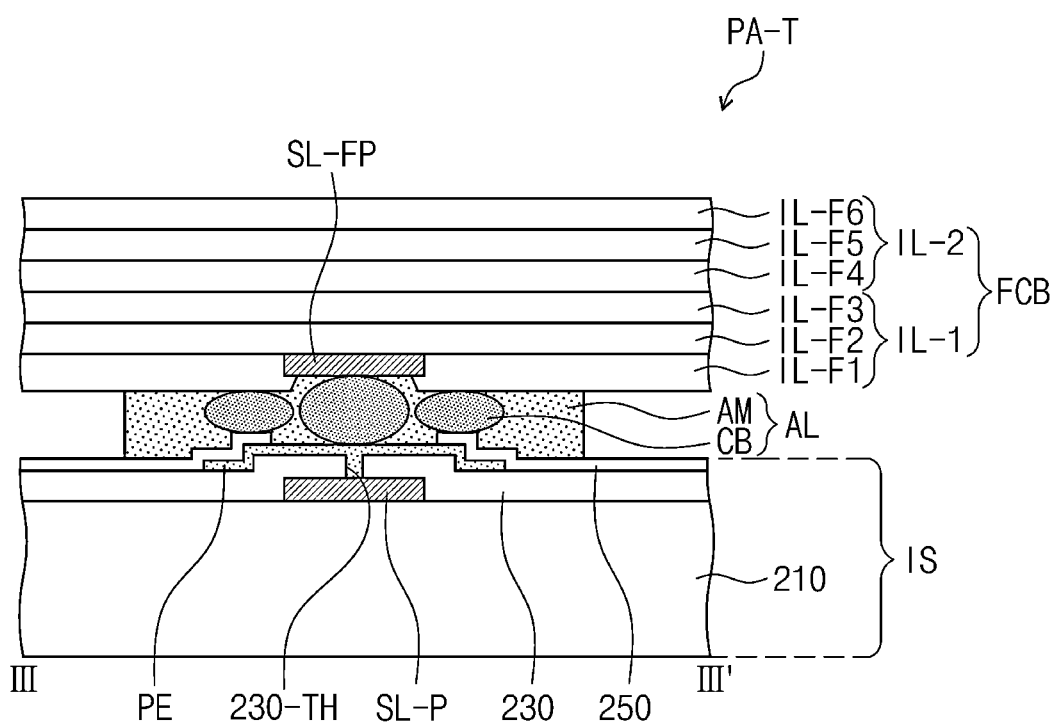
FIG. 8 is a cross-sectional view of one portion of a display module according to an embodiment of the invention.
Figure 9A:
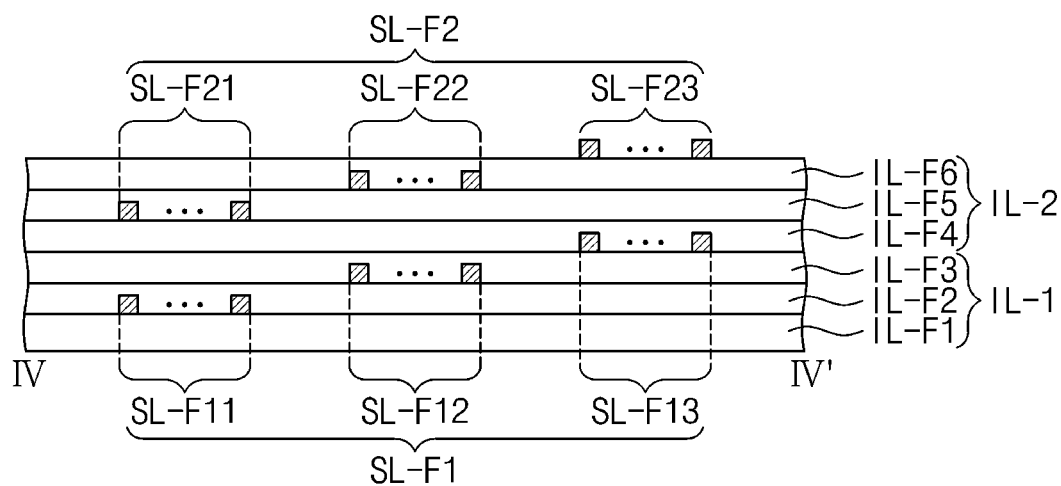
FIGS. 9A and 9B are cross-sectional views of a circuit board according to an embodiment of the invention.

FIG. 8 is a cross-sectional view of a portion of the display module according to an embodiment of the invention. FIG. 8 illustrates a cross section taken along line III-III' in FIG. 7A. FIG. 8 illustrates a cross section of a portion in which one of the plurality of circuit pads SL-FP disposed on the circuit pad region PA-T of the circuit module and one of the pad parts SL-P of the input sensor IS are electrically connected to each other.

Referring to FIG. 8, an embodiment of the circuit board FCB includes a plurality of insulating layers IL-1 and IL-2. Each of the plurality of insulating layers IL-1 and IL-2 may include a plastic resin such as polyimide or polyamide. The plurality of insulating layers IL-1 and IL-2 each include a plurality of first insulating layers IL-1 and a plurality of second insulating layers IL-2 disposed on the plurality of first insulating layers IL-1. In a portion in which the circuit module FTC and the input sensor IS are connected, the plurality of first insulating layers IL-1 may be more adjacent to the input sensor IS than the plurality of second insulating layers IL-2.

The plurality of first insulating layers IL-1 and the plurality of second insulating layers IL-2 may each include a plurality of sub-insulating layers. In an embodiment, the plurality of first insulating layers IL-1 may include a first sub-insulating layer IL-F1, a second sub-insulating layer IL-F2, and a third sub-insulating layer IL-F3. The plurality of second insulating layers IL-2 may include a fourth sub-insulating layer IL-F4, a fifth sub-insulating layer IL-F5, and a sixth sub-insulating layer IL-F6. FIG. 8 illustrates an embodiment where the plurality of first insulating layers IL-1 and the plurality of second insulating layers IL-2 each include three sub-insulating layers and the input sensor IS thus includes the total of six sub-insulating layers. However, an embodiment of the invention is not limited thereto. In an alternative embodiment, for example, the plurality of first insulating layers IL-1 and the plurality of second insulating layers IL-2 each include two sub-insulating layers, and the input sensor IS may thus include the total of four sub-insulating layers. Alternatively, the number of sub-insulating layers included in the input sensor IS may be four to six. At least one sub-insulating layer disposed on a lower side among the plurality of sub-insulating layers included in the plurality of first insulating layers IL-1 may be referred to as or define a first lower sub-insulating layer, and one sub-insulating layer disposed on an uppermost layer among the plurality of sub-insulating layers may be referred to as or define a first upper sub-insulating layer. In an embodiment, the first sub-insulating layer IL-F1 and the second sub-insulating layer IL-F2 may be the first lower sub-insulating layers, and the third sub-insulating layer IL-F3 may be the first upper sub-insulating layer. At least one sub-insulating layer disposed on a lower side among the plurality of sub-insulating layers included in the plurality of second insulating layers IL-2 may be referred to as or define a second lower sub-insulating layer, and one sub-insulating layer disposed on an uppermost layer among the plurality of sub-insulating layers may be referred to as or defined a second upper sub-insulating layer. In an embodiment, the fourth sub-insulating layer IL-F4 and the fifth sub-insulating layer IL-F5 may be the second lower sub-insulating layers, and the sixth sub-insulating layer IL-F6 may be the second upper sub-insulating layer.

The input sensor IS may include the pad part SL-P disposed on the first insulating layer 210. The input sensor IS may further include a pad electrode PE. The pad electrode PE may be disposed on the second insulating layer 230 and connected to the pad part SL-P through a through-hole 230-TH defined through the second insulating layer 230. In such an embodiment, an opening that exposes at least the pad electrode PE is defined through the third insulating layer 250 such that an exposed upper surface of the pad electrode PE may be in contact with a conductive ball CB included in the antistatic conductive adhesive layer AL. The pad electrode PE may include a TCO. The pad electrode PE may include, for example, ITO, IZO, zinc oxide (ZnO), ITZO, PEDOT, a metal nanowire, and graphene.

The circuit pad SL-FP may be disposed on one of the plurality of insulating layers IL-1 and IL-2. In an embodiment, for example, as illustrated in FIG. 8, the circuit pad SL-FP may be disposed on a lower surface of the second sub-insulating layer IL-F2. However, an embodiment of the invention may not be limited thereto, and the circuit pad SL-FP may be disposed between the plurality of sub-insulating layers included in the input sensor IS. In an embodiment, an opening that exposes a lower surface of the circuit pad SL-FP, may be defined through an insulating layer disposed below an interface, on which the circuit pad SL-FP is disposed, among the plurality of insulating layers IL-1 and IL-2, and thus the exposed lower surface of the circuit pad SL-FP may be in contact with the conductive ball CB.

The antistatic conductive adhesive layer AL may include an adhesive layer AM and a plurality of conductive balls CB mixed with the adhesive layer AM. The plurality of conductive balls CB may be randomly mixed or aligned in a single layer. The conductive balls CB may be conductive metal particles. A configuration of the antistatic conductive adhesive layer AL is not particularly limited. At a portion at which the circuit module FTC and the input sensor IS are bonded, the pressurized conductive balls CB may be respectively in contact with the pad electrode PE and the circuit pad SL-FP to electrically connect the pad electrode PE to the circuit pad SL-FP.

Figure 9B:
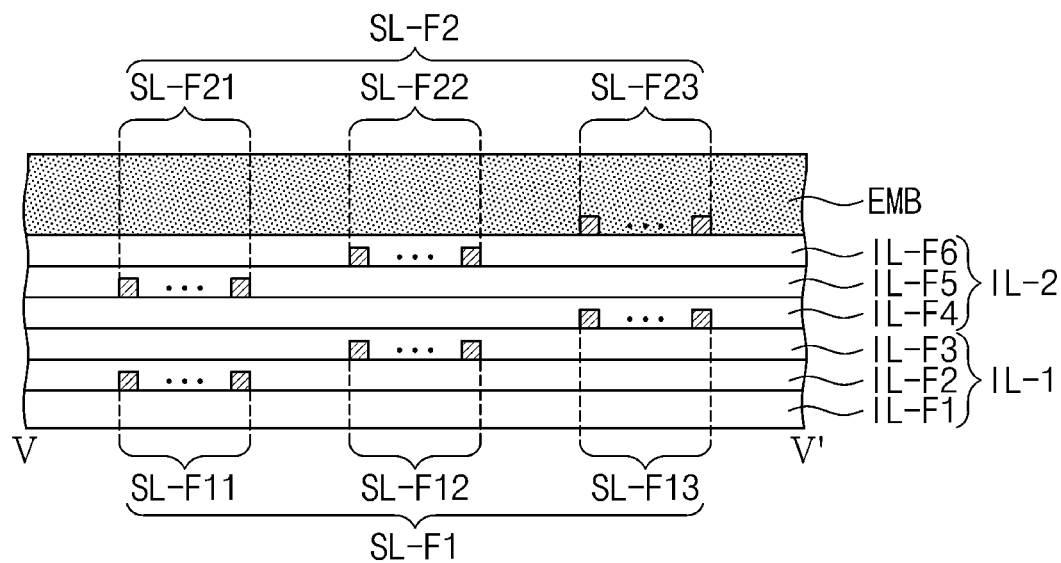

FIGS. 9A and 9B are cross-sectional views of the circuit board FCB according to an embodiment of the invention. FIG. 9A illustrates a cross section taken along line IV-IV' illustrated in FIG. 7A. FIG. 9A illustrates a cross section taken along line V-V' illustrated in FIG. 7B. More particularly, FIG. 9A illustrates one cross section on which the electromagnetic shielding layer EMB is omitted for the wiring region WA in which the plurality of group signal lines SL-F are disposed, and FIG. 9B illustrates a cross section on which the electromagnetic shielding layer EMB is disposed for the wiring region WA.

Referring to FIGS. 7A, 7B, 9A, and 9B, the plurality of group signal lines SL-F included in the circuit board FCB include a first group signal line SL-F1 and a second group signal line SL-F2. The first group signal line SL-F1 is a signal line electrically connected to the first signal line SL1 (FIG. 5B) of the input sensor IS (FIG. 5B), and a second group signal line SL-F2 is a signal line electrically connected to the second signal line SL2 (FIG. 5B) of the input sensor IS (FIG. 5B). Although not illustrated, the plurality of group signal lines SL-F may further include a third group signal line electrically connected to a third signal line SL3 (FIG. 5B) of the input sensor IS (FIG. 5B).

The plurality of first group signal lines SL-F1 and the plurality of second group signal lines SL-F2 may each include a plurality of sub-group signal lines disposed in different layers from each other. The plurality of first group signal lines SL-F1 may include a plurality of first first group signal lines SL-F11, a plurality of second first group signal lines SL-F12, and a plurality of third first group signal lines SL-F13. The plurality of second group signal lines SL-F2 may include a plurality of first second group signal lines SL-F21, a plurality of second second group signal lines SL-F22, and a plurality of third second group signal lines SL-F23.

At least a portion of the first group signal lines SL-F1 and at least a portion of the second group signal lines SL-F2 may be disposed in different layers from each other. In an embodiment, at least a portion of the plurality of first group signal lines SL-F1 may be disposed on the first insulating layer IL-1, and at least a portion of the plurality of second group signal lines SL-F2 may be disposed on the second insulating layer IL-2.

The plurality of sub-group signal lines included in the plurality of first group signal lines SL-F1 and the plurality of second group signal lines SL-F2 may be disposed on different sub-insulating layers, respectively. In an embodiment, the plurality of first first group signal lines SL-F11 may be disposed on the first sub-insulating layer IL-F1, the plurality of second first group signal lines SL-F12 may be disposed on the second sub-insulating layer IL-F2, and the plurality of third first group signal lines SL-F13 may be disposed on the third sub-insulating layer IL-F3. In an embodiment, the plurality of first second group signal lines SL-F21 may be disposed on the fourth sub-insulating layer IL-F4, the plurality of second second group signal lines SL-F22 may be disposed on the fifth sub-insulating layer IL-F5, and the plurality of third second group signal lines SL-F23 may be disposed on the sixth sub-insulating layer IL-F6.

At least one of the plurality of sub-group signal lines included in the plurality of first group signal lines SL-F1 and the plurality of second group signal lines SL-F2 may at least partially overlap, on a plane, other sub-group signal lines. For example, as illustrated in FIG. 9A, at least a portion of the first first group signal lines SL-F11 disposed on the first sub-insulating layer IL-F1 and at least a portion of the first second group signal lines SL-F21 disposed on the fourth sub-insulating layer IL-F4 may overlap each other on a plane. In addition, at least a portion of the second first group signal lines SL-F12 disposed on the second sub-insulating layer IL-F2 and at least a portion of the second second group signal line SL-F22 disposed on the fifth sub-insulating layer IL-F5 may overlap each other on a plane. Moreover, at least a portion of the third first group signal line SL-F13 disposed on the third sub-insulating layer IL-F3 and at least a portion of the third second group signal lines SL-F23 disposed on the sixth sub-insulating layer IL-F6 may overlap each other on a plane. However, an embodiment of the invention is not limited thereto. As long as at least one of the plurality of sub-group signal lines is disposed to at least partially overlap other sub-group signal lines on a plane, an arrangement relationship between the plurality of sub-group signal lines included in the plurality of first group signal lines SL-F1 and the plurality of second group signal lines SL-F2 may be variously modified without being limited.

In the plurality of group signal lines SL-F1 and SL-F2, a signal line disposed on an uppermost layer of the plurality of insulating layers IL-1 and IL-2 may be referred to as an outermost signal line. In an embodiment, for example, in the embodiment illustrated in FIG. 9A, the uppermost layer of the plurality of insulating layers IL-1 and IL-2 may be the sixth sub-insulating layer IL-F6, and an outermost signal line may be the third second group signal line SL-F23 disposed on the sixth sub-insulating layer IL-F6. The third second group signal line SL-F23, which is an outermost signal line, may be directly disposed on the sixth sub-insulating layer IL-F6 which is an uppermost layer of the plurality of insulating layers IL-1 and IL-2. In the input sensor IS, another insulating layer may not be disposed on the third second group signal line SL-F23, which is an outermost signal line. That is, the plurality of insulating layers IL-1 and IL-2 may not include another insulating layer on the third second group signal line SL-F23, which is an outermost signal line.

The electromagnetic shielding layer EMB is disposed on the plurality of insulating layers IL-1 and IL-2, and covers the outermost signal line disposed on the uppermost layer of the plurality of insulating layers IL-1 and IL-2. In an embodiment, for example, as illustrated in FIG. 9A, the electromagnetic shielding layer EMB may cover the third second group signal line SL-F23, which is an outermost signal line. The electromagnetic shielding layer EMB may be in contact with an upper surface of the third second group signal line SL-F23 and entirely cover the third second group signal line SL-F23. In a portion in which the third second group signal line SL-F23 is not disposed, the electromagnetic shielding layer EMB may be in contact with an upper surface of the sixth sub-insulating layer IL-F6, which is the uppermost layer, among the plurality of insulating layers IL-1 and IL-2. In an embodiment, the electromagnetic shielding layer EMB may include a metal shielding layer and an adhesive layer, and the third second group signal line SL-F23, which is an outermost signal line, may be covered by the adhesive layer included in the electromagnetic shielding layer EMB.

Referring to FIGS. 5A to 6, 7A, 7B, 9A and 9B, an embodiment of the display module DM according to the invention may have, as an anti-reflection layer LF, a structure which has a plurality of color filters 320 and a division layer 310, in place of a conventional polarization film. In such an embodiment where the anti-reflection layer LF does not include a polarization film, the thickness of the anti-reflection layer LF may be reduced, and a reference capacitance may increase, and thus, a bandwidth and sensing sensitivity of the input sensor may be deteriorated.

In the input sensor IS included in an embodiment of the display module DM according to the invention, the signal lines connected to the first sensing electrode E1-1 to E1-4 include first signal lines SL1 connected to one-side ends of both ends of the first sensing electrodes E1-1 to E1-4, and second signal lines SL2 connected to the other-side ends of the both ends of the first sensing electrodes E1-1 to E1-4. Thus, deterioration of the bandwidth, caused by a reduction in the thickness of the anti-reflection layer LF, may be compensated, and accordingly, the sensing sensitivity of the input sensor IS may be enhanced.

In an embodiment having a structure in which the first signal lines SL1 and the second signal lines SL2 are connected to the both ends of the first sensing electrodes E1-1 to E1-4, respectively, the number of group signal lines SL-F of the circuit board FCB, connected respectively to the first signal lines SL1 and the second signal lines SL2 may increase. When the number of the group signal lines SL-F increases, a large number of group signal lines SL-F may be disposed in a limited wiring region WA. Accordingly, the group signal lines SL-F may be separately disposed in different insulating layers from each other. In such an embodiment, a group signal line SL-F may not be covered by the insulating layers and thus exposed. In such an embodiment, in the plurality of group signal lines SL-F described above, an outermost signal line disposed on an uppermost layer of the plurality of insulating layers IL-1 and IL-2 may be provided in a form of not being covered by other insulating layers and being thus exposed.

According to an embodiment of the invention, an electronic device includes an electromagnetic shielding layer EMB disposed to overlap at least a portion of a plurality of group signal lines SL-F, and may thus cover an outermost signal line that is not covered by other insulating layers and thus exposed. Thus, in such an embodiment, the outermost signal line may be effectively prevented from being interfered by external electromagnetic waves, and the operating environment of the outermost signal line may be stabilized, thereby preventing electromagnetic waves generated from the outermost signal line from interfering other components included in the electronic device. Accordingly, the reliability of the electronic device including the electromagnetic shielding layer EMB may be enhanced.

In embodiments of the invention, as described above, an input sensor may enhance sensing sensitivity by preventing degradation of a bandwidth thereof. In such embodiments, since an electromagnetic shielding layer prevents the occurrence of noise in group wires included in a circuit board electrically connected to the input sensor, the operating environment of the group wires may be stabilized. Accordingly, an electronic device including the input sensor and the circuit board may have improved reliability by preventing failure while having high sensing sensitivity.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An electronic device comprising:
a display panel including a plurality of light-emitting elements, a first region having a transmissive region and an element region, and a second region adjacent to the first region;
a window disposed on the display panel;
an electronic module disposed below the first region of the display panel;
a housing disposed below the display panel and the electronic module;
an input sensor disposed between the display panel and the window, wherein the input sensor includes a plurality of signal lines; and
a circuit board electrically connected to the input sensor, wherein the circuit board includes:
a plurality of insulating layers;
a plurality of group signal lines connected to at least one selected from the plurality of signal lines, wherein the plurality of group signal lines includes an outermost signal line disposed on an uppermost layer among the plurality of insulating layers; and
an electromagnetic shielding layer disposed on the outermost signal line.

2. The electronic device of claim 1, wherein
the plurality of insulating layers comprise a first insulating layer, and a second insulating layer disposed on the first insulating layer,
the second insulating layer comprises a plurality of sub-insulating layers,
the plurality of group signal lines comprise a first group signal line, and a second group signal line, and
the portion of the second group signal line is disposed on an uppermost layer among the plurality of sub-insulating layers.

3. The electronic device of claim 2, wherein
the first insulating layer comprises:
a first lower sub-insulating layer; and
a first upper sub-insulating layer disposed on the first lower sub-insulating layer, the second insulating layer comprises:
a second lower sub-insulating layer; and
a second upper sub-insulating layer disposed on the second lower sub-insulating layer, and
the portion of the second group signal line is disposed on the second upper sub-insulating layer.

4. The electronic device of claim 3, wherein
the second group signal line comprises an outermost signal line disposed on the second upper sub-insulating layer, and
the electromagnetic shielding layer covers the outermost signal line.

5. The electronic device of claim 3, wherein
the portion of the second group signal line is disposed on the second lower sub-insulating layer, and
another portion of the second group signal line is disposed on the second upper sub-insulating layer.

6. The electronic device of claim 1, further comprising:
an anti-reflection layer disposed on the input sensor,
wherein the anti-reflection layer comprises:
a division layer in which a plurality of division openings overlapping the plurality of light-emitting elements, respectively, are defined; and
a plurality of color filters disposed corresponding to the plurality of division openings, respectively.

7. The electronic device of claim 6, further comprising:
a shock absorbing layer disposed on the anti-reflection layer.

8. The electronic device of claim 1,
wherein the window comprises a window protective layer and a thin film glass substrate.

9. The electronic device of claim 1, wherein the electronic module receives an optical signal.

10. The electronic device of claim 1, wherein the display panel comprises a first non-folding region, a second non-folding region, and a folding region between the first non-folding region and the second non-folding region.

11. The electronic device of claim 1, wherein the input sensor and the circuit board are electrically connected to each other by an anisotropic conductive adhesive layer.

12. The electronic device of claim 1, wherein
the display panel further comprises an encapsulation layer which covers the plurality of light-emitting elements, and
the input sensor is disposed directly on the encapsulation layer.

13. The electronic device of claim 1, further comprising:
a support layer disposed below the display panel;
a cover layer disposed below the support layer; and
a digitizer disposed below the cover layer.

14. An electronic device comprising:
a display panel including a plurality of light-emitting elements, a first region having a transmissive region and an element region, and a second region adjacent to the first region;
a window disposed on the display panel;
an electronic module disposed below the first region of the display panel;
a housing disposed below the display panel and the electronic module;
an input sensor disposed between the display panel and the window;

a circuit board electrically connected to the input sensor;
a support layer disposed below the display panel;
a cover layer disposed below the support layer; and
a digitizer disposed below the cover layer,
wherein the circuit board includes:
  a plurality of insulating layers;
  a plurality of group signal lines includes an outermost signal line disposed on an uppermost layer among the plurality of insulating layers; and
  an electromagnetic shielding layer disposed on the outermost signal line.

15. An electronic device comprising:
a display panel;
an input sensor disposed on the display panel; and
a circuit board electrically connected to the input sensor,
wherein the circuit board includes:
  a plurality of insulating layers;
  a plurality of group signal lines including an outermost signal line disposed on an uppermost layer among the plurality of insulating layers; and
  an electromagnetic shielding layer disposed on the outermost signal line, wherein the electromagnetic shielding layer is in contact with an upper surface of the outermost signal line.

* * * * *